United States Patent
Matsutani et al.

(10) Patent No.: US 8,461,699 B2
(45) Date of Patent: *Jun. 11, 2013

(54) POSITIVE-TYPE PHOTOSENSITIVE RESIN COMPOSITION, METHOD FOR PRODUCING RESIST PATTERN, SEMICONDUCTOR DEVICE, AND ELECTRONIC DEVICE

(75) Inventors: Hiroshi Matsutani, Hitachi (JP); Takumi Ueno, Hitachi (JP); Alexandre Nicolas, Hitachi (JP); Yukihiko Yamashita, Tsukuba (JP); Ken Nanaumi, Chikusei (JP); Akitoshi Tanimoto, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 18 days.

This patent is subject to a terminal disclaimer.

(21) Appl. No.: 13/142,057

(22) PCT Filed: Dec. 16, 2009

(86) PCT No.: PCT/JP2009/070987
§ 371 (c)(1),
(2), (4) Date: Jun. 24, 2011

(87) PCT Pub. No.: WO2010/073948
PCT Pub. Date: Jul. 1, 2010

(65) Prior Publication Data
US 2011/0254178 A1  Oct. 20, 2011

(30) Foreign Application Priority Data

Dec. 26, 2008 (JP) ................. P2008-334127
Apr. 30, 2009 (JP) ................. P2009-110997
Oct. 23, 2009 (JP) ................. P2009-244379

(51) Int. Cl.
*H01L 23/29* (2006.01)
*G03C 1/00* (2006.01)

(52) U.S. Cl.
USPC ........... 257/788; 257/791; 257/792; 257/793; 257/E23.116; 257/E23.119; 430/270.1; 430/285.1; 430/326

(58) Field of Classification Search
USPC .. 257/787, 788, 791–793, E23.116–E23.119; 430/270.1, 285.1, 328
See application file for complete search history.

(56) References Cited

U.S. PATENT DOCUMENTS 3,957,512 A    5/1976  Kleeberg et al.
2002/0189476 A1 * 12/2002  Aoshima ................. 101/453
(Continued)

FOREIGN PATENT DOCUMENTS

CN    1128362    8/1996
CN    1864099    11/2006
(Continued)

OTHER PUBLICATIONS

U.S. Appl. No. 13/060,763, Feb. 25, 2011.*
(Continued)

*Primary Examiner* — Jasmine Clark
(74) *Attorney, Agent, or Firm* — Antonelli, Terry, Stout & Kraus, LLP.

(57) ABSTRACT

The positive tone photosensitive composition of the invention comprises an alkali-soluble resin having a phenolic hydroxyl group, a compound producing an acid by light, a thermal crosslinking agent and an acrylic resin. It is possible to provide a positive tone photosensitive composition that can be developed with an aqueous alkali solution, has sufficiently high sensitivity and resolution, and can form a resist pattern with excellent adhesiveness and thermal shock resistance.

28 Claims, 9 Drawing Sheets

U.S. PATENT DOCUMENTS

2004/0094752 A1* 5/2004 Ito et al. .................. 252/578
2007/0020559 A1* 1/2007 Hatanaka .................. 430/270.1

FOREIGN PATENT DOCUMENTS

| | | |
|---|---|---|
| EP | 2328027 | 6/2011 |
| JP | 49-115541 | 11/1974 |
| JP | 59-108031 | 6/1984 |
| JP | 61-156251 | 7/1986 |
| JP | 2004-2753 | 1/2004 |
| JP | 2004-190008 | 7/2004 |
| JP | 2006-106214 | 4/2006 |
| JP | 3812654 | 6/2006 |
| JP | 2007-128067 | 5/2007 |
| JP | 2007-316577 | 12/2007 |
| JP | 2008-185692 | 8/2008 |
| JP | 2008-268788 | 11/2008 |
| JP | 2008-309885 | 12/2008 |
| JP | 2010-039270 | 2/2010 |
| WO | WO 2004/006020 A1 | 1/2004 |
| WO | WO 2007/006666 | 1/2007 |
| WO | 2007/026475 | 3/2007 |
| WO | WO 2007/066661 A1 | 6/2007 |
| WO | WO 2008/026406 | 6/2008 |

OTHER PUBLICATIONS

Japanese Official Action dated Jul. 24, 2012, for JP Application No. 2010-544019.

Translation of the International Preliminary Report on Patentability dated Aug. 25, 2011, for International (PCT) Application No. PCT/JP2009/070987.

Extended European Search Report dated Aug. 8, 2012, including the Supplementary European Search Report and European Search Opinion, for EP Application No. 09834751.1-1226/2372457 (PCT/JP2009/070987).

Chinese Official Action dated Aug. 9, 2012, for CN Application No. 200980151852.8.

* cited by examiner

POSITIVE-TYPE PHOTOSENSITIVE RESIN COMPOSITION, METHOD FOR PRODUCING RESIST PATTERN, SEMICONDUCTOR DEVICE, AND ELECTRONIC DEVICE

TECHNICAL FIELD

The present invention relates to a positive tone photosensitive composition, a method for producing a resist pattern, a semiconductor device and an electronic device.

BACKGROUND ART

With the increasingly high integration and greater sizes of semiconductor elements in recent years, there have arisen demands for thinner and lighter-weight package boards. This has in turn led to demand for formation of insulating layers by materials exhibiting more excellent electrical characteristics, heat resistance and mechanical properties, in package boards with semiconductor element surface protective layers, interlayer insulating films or redistribution layers (hereunder also referred to as "semiconductor devices"). Polyimide resins are materials that can satisfy such demands, and research has been conducted on the use of photosensitive polyimides, for example, that are polyimide resins imparted with photosensitive properties. Using a photosensitive polyimide has the advantage of simplifying the pattern formation steps and allowing complex production steps to be shortened (see Patent documents 1 and 2, for example).

Cured films of polyimide resins are generally formed by producing a thin-film by a method such as spin coating of a solution (or "varnish") of a polyimide precursor (polyamide acid) obtained by reacting a tetracarboxylic acid dianhydride with a diamine, and performing thermal dehydrating cyclization (see Non-patent document 1, for example). The polyimide resin is cured through the process of dehydrating cyclization. However, when a polyimide resin is obtained using a polyimide precursor, volume shrinkage occurs due to dehydration (imidation) during curing, and this can cause problems such as loss of film thickness and reduced dimensional precision. Furthermore, lower-temperature film-forming processes are desired in recent years, and there is a demand for polyimide resins that are capable of dehydrating cyclization at low temperature, while exhibiting physical properties after dehydrating cyclization that are comparable to those of films obtained by dehydrating cyclization at high temperature. However, curing of polyimide precursors at low temperature results in incomplete imidation and therefore reduced physical properties, including brittleness of the produced cured film.

Another subject of study is photosensitive resins that employ other polymers with high heat resistance, and that do not require the dehydrating cyclization as polyimide precursors (see Non-patent document 2 and Patent documents 3-7, for example).

CITATION LIST

Patent Literature

[Patent document 1] Japanese Unexamined Patent Application Publication SHO No. 49-115541
[Patent document 2] Japanese Unexamined Patent Application Publication SHO No. 59-108031
[Patent document 3] International Patent Publication No. WO2004/006020
[Patent document 4] Japanese Unexamined Patent Application Publication No. 2006-106214
[Patent document 5] Japanese Unexamined Patent Application Publication No. 2004-2753
[Patent document 6] Japanese Unexamined Patent Application Publication No. 2004-190008
[Patent document 7] Japanese Patent Publication No. 3812654

Non-Patent Literature

[Non-patent document 1] "Current polyimides—Fundamentals and applications", (2002), Nihon Polyimide Kenkyu-kai.
[Non-patent document 2] J. Photopolym. Sci. Technol. 2005, Vol. 18, p. 321-325

SUMMARY OF INVENTION

Technical Problem

In recent years, positive tone photosensitive compositions capable of forming patterns with high heat resistance, while allowing development by aqueous alkali solutions, have been a desired goal for uses of surface protecting films and cover coat layers in semiconductor devices with redistribution layers, from the viewpoint of reducing environmental load.

From the viewpoint of reducing damage to semiconductor devices by high temperature, there is a demand for positive tone photosensitive resin compositions comprising polymers that can be cured at low temperature and do not require dehydrating cyclization.

It is therefore an object of the present invention to provide a positive tone photosensitive composition that can be cured at low temperature, can be developed with an aqueous alkali solution, has sufficiently high sensitivity and resolution and can form resist patterns with excellent adhesiveness and thermal shock resistance, as well as a method for producing a resist pattern using the positive tone photosensitive composition, a semiconductor device having a resist pattern formed by the method, and an electronic device comprising the semiconductor device.

Solution to Problem

The invention provides a positive tone photosensitive composition comprising (A) an alkali-soluble resin having a phenolic hydroxyl group, (B) a compound producing an acid by light, (C) a thermal crosslinking agent and (D) an acrylic resin.

This positive tone photosensitive composition can be cured at low temperature, has sufficiently high sensitivity and resolution, and can form resist patterns having excellent adhesiveness and satisfactory thermal shock resistance. Although the reason for the effect obtained by the positive tone photosensitive composition of the invention is not fully understood, the present inventors have conjectured as follows.

It is believed that the positive tone photosensitive composition, which employs a (D) acrylic resin and particularly an acrylic resin having the specified structure described below, forms extremely fine domains (a microphase separated condition) derived from the (D) acrylic resin when it is formed into a cured film. When such a microphase separated condition is formed and stress is generated, Brownian motion is activated in the fine domains derived from the (D) acrylic resin, and divergence of the stress as heat can relax the stress, this relaxation of stress allowing the thermal shock resistance to be improved.

Furthermore, it is thought that the use of component (D) together with components (A)-(C) allows the positive tone photosensitive composition of the invention to simultaneously exhibit sufficiently high sensitivity, resolution and adhesiveness.

The present inventors, employing residual stress as an index of the aforementioned stress relaxation, have confirmed that the residual stress of a cured film obtained from the positive tone photosensitive composition of the invention is low. A lower residual stress may be evaluated as more excellent thermal shock resistance.

Component (A) of the invention can further reduce volume shrinkage during curing of the positive tone photosensitive composition, and it is preferably a phenol resin, for availability at low cost.

Component (A) preferably comprises (A1) a phenol resin having no unsaturated hydrocarbon group, and (A2) a modified phenol resin having an unsaturated hydrocarbon group.

Component (A2) is preferably an additionally modified compound by reaction between a phenolic hydroxyl group and a polybasic acid anhydride, for further improved solubility in aqueous alkali solutions.

Component (A2) is more preferably a phenol resin modified with a compound having a C4-C100 unsaturated hydrocarbon group, from the viewpoint of improving the mechanical properties (breaking elongation, elastic modulus and residual stress). After exposure and development of the photosensitive resin composition layer formed from the positive tone photosensitive composition comprising the modified phenol resin, the modified phenol resin will have double bonds in the molecule, derived from the compound with a C4-C100 unsaturated hydrocarbon group, and therefore curing of the patterned photosensitive resin film proceeds adequately by crosslinking of these double bonds. The mechanical properties of the formed resist pattern are presumably improved for this reason. Furthermore, the use of a modified phenol resin together with component (A1) allows the positive tone photosensitive composition of the invention to simultaneously exhibit sufficiently high sensitivity, resolution and adhesiveness.

Furthermore, the ratio $M_{A1}/M_{A2}$ of the mass $M_{A1}$ of component (A1) and the mass $M_{A2}$ of component (A2) is preferably 5/95-95/5, as this will allow the sensitivity and resolution during resist pattern formation, as well as the adhesiveness, mechanical properties and thermal shock resistance of the cured resist pattern, to be further improved.

Component (B) is preferably an o-quinonediazide compound, as this will further improve the sensitivity during formation of the resist pattern.

Also, the component (B) content is preferably 3-100 parts by mass with respect to 100 parts by mass of the component (A) content, since this will further improve the resolution during formation of the resist pattern.

Component (D) is preferably an acrylic resin with one or more structural units represented by the following formulas (1)-(3).

[Chemical Formula 1]

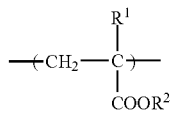

(1)

[Chemical Formula 2]

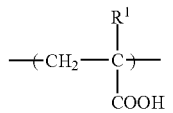

(2)

[Chemical Formula 3]

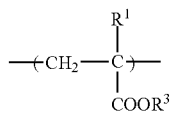

(3)

[In formulas (1)-(3), $R^1$ represents hydrogen atom or a methyl group, $R^2$ represents a C4-C20 alkylene group, and $R^3$ represents a monovalent organic group with a primary, secondary or tertiary amino group.]

Also, component (D) is more preferably an acrylic resin having a structural unit represented by formula (1) and a structural unit represented by formula (2), and even more preferably it is an acrylic resin having a structural unit represented by formula (1), a structural unit of formula (2) and a structural unit represented by formula (3).

The positive tone photosensitive composition of the invention preferably further comprises (E) a compound that produces an acid by heat. In addition to the effects described above, this will allow formation of a resist pattern with minimal pattern melting and excellent resolution, as well as adequately inhibited cracking and excellent adhesiveness and thermal shock resistance, by development using an aqueous alkali solution.

Component (E) is preferably a component having the structure represented by the following formula (1).

[Chemical Formula 4]

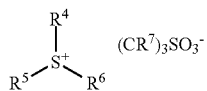

(4)

[In formula (4), $R^4$, $R^5$ and $R^6$ each independently represents an alkyl group or aryl group, and $R^7$ represents hydrogen atom or fluorine atom.]

The positive tone photosensitive composition of the invention preferably further comprises (F) an elastomer. The obtained resist pattern will thus be even more superior in terms of flexibility, and the mechanical properties and thermal shock resistance of the resist pattern will be able to be further improved.

The invention further provides a method for producing a resist pattern, comprising a step of exposing a photosensitive resin film formed using the positive tone photosensitive composition of the invention, a step of developing the exposed photosensitive resin film with an aqueous alkali solution to form a pattern, and a step of heating the photosensitive resin film formed into the pattern. Since this production method employs the positive tone photosensitive composition described above, it allows formation of a resist pattern with sufficiently high sensitivity and resolution, as well as satisfactory adhesiveness and thermal shock resistance.

The method for producing a resist pattern according to the invention preferably further comprises the step of heating the patterned photosensitive resin film at not higher than 200° C. This can adequately prevent damage due to heating of the electronic device.

The invention yet further provides a semiconductor device having a resist pattern formed by the production method described above, as an interlayer insulating film or surface protective layer. Such a semiconductor device exhibits an excellent effect because it has a resist pattern formed from the positive tone photosensitive composition described above.

The preferred modes of the semiconductor device of the invention are:

a semiconductor device having a resist pattern formed by the production method described above as a cover coat layer;

a semiconductor device having a resist pattern formed by the production method described above as a core for a redistribution layer;

a semiconductor device having a resist pattern formed by the production method described above as a collar for holding a conductive ball serving as an external connecting terminal; and a semiconductor device having a resist pattern formed by the production method described above as an underfill.

The invention yet further provides an electronic device comprising a semiconductor device according to the invention. Such an electronic device has sufficiently excellent reliability because it has a resist pattern formed from a positive tone photosensitive composition of the invention.

Advantageous Effects of Invention

According to the invention it is possible to provide a positive tone photosensitive composition that can be cured at low temperature, can be developed with an aqueous alkali solution, has sufficiently high sensitivity and resolution, and can form a resist pattern with excellent adhesiveness and thermal shock resistance. The positive tone photosensitive composition of the invention allows formation of a resist pattern by a low temperature heating process of not higher than 200° C., and it is therefore possible to prevent damage to electronic devices by heating, and to provide highly reliable semiconductor devices at high yield.

The invention further provides a method for forming a resist pattern with satisfactory adhesiveness and thermal shock resistance, at sufficiently high sensitivity and resolution, using the positive tone photosensitive composition, as well as a semiconductor device having a resist pattern formed by the method, and an electronic device comprising the semiconductor device. A resist pattern formed by the method of the invention has a satisfactory shape and satisfactory properties, as well as low volume shrinkage during curing, and thus exhibits high dimensional stability.

DESCRIPTION OF EMBODIMENTS

Figure 1:
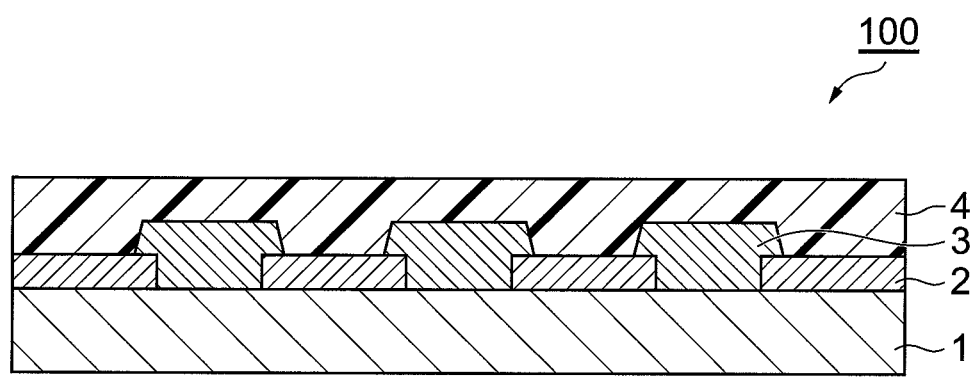
FIG. 1 is a simplified cross-sectional view for explanation of an embodiment of the production steps for a semiconductor device.

Preferred embodiments of the invention will now be explained in detail, with reference to the accompanying drawings as necessary. Throughout the drawings, corresponding elements will be referred to by like reference numerals and will be explained only once. Unless otherwise specified, the vertical and horizontal positional relationships are based on the positional relationships in the drawings. Also, the dimensional proportions depicted in the drawings are not necessarily limitative. The term "(meth)acrylate" used throughout the present specification refers to the "acrylate" and its corresponding "methacrylate". Similarly, the term "(meth)acrylic" used throughout the present specification refers to the "acrylic" compound and its corresponding "methacrylic" compound.

[Positive Tone Photosensitive Composition]

The positive tone photosensitive composition of the invention comprises (A) an alkali-soluble resin having a phenolic hydroxyl group, (B) a compound producing an acid by light, (C) a thermal crosslinking agent and (D) an acrylic resin. Each of the components in the positive tone photosensitive composition will now be described.

<Component (A)>

Component (A): Alkali-Soluble Resin Having a Phenolic Hydroxyl Group

Component (A) is a resin that has a phenolic hydroxyl group in the molecule and is soluble in alkali developing solutions. Examples of alkali-soluble resins having phenolic hydroxyl groups for component (A) include hydroxystyrene-based resins, such as polyhydroxystyrene and copolymers comprising hydroxystyrene as a monomer unit, phenol resins, polybenzooxazole precursors such as poly(hydroxyamide), poly(hydroxyphenylene)ethers and polynaphthols. Component (A) may be composed of only a single one of these resins, or it may comprise two or more thereof.

Phenol resins are preferred and novolac-type phenol resins are especially preferred, for their low cost, high contrast and low volume shrinkage during curing. Hydroxystyrene-based resins are also preferred for excellent electrical characteristics (insulating property) and low volume shrinkage during curing.

A phenol resin is the polycondensation product of a phenol or its derivative with an aldehyde. Polycondensation is conducted in the presence of a catalyst such as an acid or base. A phenol resin obtained using an acid catalyst is referred to specifically as a novolac-type phenol resin. Specific examples of novolac resins include phenol/formaldehyde-novolac resins, cresol/formaldehyde-novolac resins, xylylenol/formaldehyde-novolac resins, resorcinol/formaldehyde-novolac resins and phenol-naphthol/formaldehyde-novolac resins.

Examples of phenol derivatives to be used to obtain phenol resins include alkylphenols such as o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol and 3,4,5-trimethylphenol, alkoxyphenols such as methoxyphenol and 2-methoxy-4-methylphenol, alkenylphenols such as vinylphenol and allylphenol, aralkylphenols such as benzylphenol, alkoxycarbonylphenols such as methoxycarbonylphenol, arylcarbonylphenols such as benzoyloxyphenol, halogenated phenols such as chlorophenol, polyhydroxybenzenes such as catechol, resorcinol and pyrogallol, bisphenols such as bisphenol A and bisphenol F, naphthol derivatives such as α and β-naphthols, hydroxyalkylphenols such as p-hydroxyphenyl-2-ethanol, p-hydroxyphenyl-3-propanol and p-hydroxyphenyl-4-butanol, hydroxyalkylcresols such as hydroxyethylcresol, alcoholic hydroxyl group-containing phenol derivatives such as bisphenol monoethylene oxide addition products and bisphenol monopropylene oxide addition products, and carboxyl group-containing phenol derivatives such as p-hydroxyphenylacetic acid, p-hydroxyphenylpropionic acid, p-hydroxyphenylbutanoic acid, p-hydroxycinnamic acid, hydroxybenzoic acid, hydroxyphenylbenzoic acid, hydroxyphenoxybenzoic acid and diphenolic acid. Methylolated forms of the aforementioned phenol derivatives, such as bishydroxymethyl-p-cresol, may also be used as phenol derivatives.

The phenol resin may also be a product obtained by condensation polymerization of an aldehyde with phenol or a phenol derivative together with a compound other than a phenol, such as m-xylene. In this case, the molar ratio of the compound other than a phenol with respect to the phenol derivative used for condensation polymerization is preferably less than 0.5.

The phenol derivatives and compounds other than phenol compounds may be used alone or in combinations of two or more.

The aldehyde used to obtain the phenol resin is selected from among, for example, formaldehyde, acetaldehyde, furfural, benzaldehyde, hydroxybenzaldehyde, methoxybenzaldehyde, hydroxyphenylacetaldehyde, methoxyphenylacetaldehyde, crotonaldehyde, chloroacetaldehyde, chlorophenylacetaldehyde, acetone, glyceraldehyde, glyoxylic acid, methyl glyoxylate, phenyl glyoxylate, hydroxyphenyl glyoxylate, formylacetic acid, methyl formylacetate, 2-formylpropionic acid, methyl 2-formylpropionate, pyruvic acid, levulinic acid, 4-acetylbutyric acid, acetonedicarboxylic acid and 3,3'-4,4'-benzophenonetetracarboxylic acid. Formaldehyde precursors such as paraformaldehyde and trioxane may also be used in the reaction. These may be used as single compounds or as combinations of two or more compounds.

Examples of hydroxystyrene-based resins to be used include those obtained by polymerization (vinyl polymerization) of the ethylenic unsaturated double bonds of hydroxystyrene having an introduced protecting group, in the presence of a catalyst (radical initiator), followed by deprotection. There may also be used a branched poly(hydroxystyrene) such as PHS-B (trade name of DuPont Corp.).

A publicly known compound having an alkyl or silyl group as the hydroxystyrene protecting group may also be used. A vinyl group-containing monomer such as styrene, (meth)acrylic acid or a (meth)acrylic acid ester may also be copolymerized with hydroxystyrene having a protecting group introduced therein.

The weight-average molecular weight of component (A) is preferably about 500-500,000. The weight-average molecular weight referred to here is the value obtained by measurement by gel permeation chromatography and calculation using a standard polystyrene calibration curve.

Component (A) according to the invention is preferably one comprising (A1) a phenol resin and/or hydroxystyrene-based resin having no unsaturated hydrocarbon group and (A2) a modified phenol resin having an unsaturated hydrocarbon group, and more preferably component (A2) is further modified by reaction between a phenolic hydroxyl group and a polybasic acid anhydride.

Component (A2) is more preferably a phenol resin modified with a compound having a C4-C100 unsaturated hydrocarbon group, from the viewpoint of improving the mechanical properties (breaking elongation, elastic modulus and residual stress).

The (A2) modified phenol resin having an unsaturated hydrocarbon group is generally the product of condensation polymerization between the reaction product of a phenol or its derivative and a (preferably C4-C100) compound having an unsaturated hydrocarbon group (hereunder also referred to simply as "unsaturated hydrocarbon group-containing compound") (this reaction product will hereunder be referred to as "unsaturated hydrocarbon group-modified phenol derivative"), and an aldehyde, or the reaction product of a phenol resin and an unsaturated hydrocarbon group-containing compound. The phenol derivative referred to here may be the same as the phenol derivative mentioned above as the starting material for the phenol resin as component (A).

The unsaturated hydrocarbon groups of the unsaturated hydrocarbon group-containing compound preferably include two or more unsaturated groups, from the viewpoint of adhesiveness and thermal shock resistance of the resist pattern. From the viewpoint of compatibility as a resin composition, and cured film flexibility, the unsaturated hydrocarbon group-containing compound is preferably a C8-C80 compound and more preferably a C10-C60 compound.

Examples of unsaturated hydrocarbon group-containing compounds are polybutadienes, epoxidated polybutadienes, linoleyl alcohol, oleyl alcohol, unsaturated fatty acids and unsaturated fatty acid esters that have C4-C100 unsaturated hydrocarbon and carboxyl groups. Preferred unsaturated fatty acids include crotonic acid, myristoleic acid, palmitoleic acid, oleic acid, elaidic acid, vaccenic acid, gadoleic acid, erucic acid, nervonic acid, linolic acid, α-linolenic acid, eleostearic acid, stearidonic acid, arachidonic acid, eicosapentaenoic acid, clupanodonic acid and docosahexaenoic acid. Particularly preferred among these are esters of C8-C30 unsaturated fatty acids and C1-C10 monovalent to trivalent alcohols, and esters of C8-C30 unsaturated fatty acids and the trivalent alcohol glycerin are especially preferred.

Esters of C8-C30 unsaturated fatty acids and glycerin are commercially available as vegetable oils. Vegetable oils include non-drying oils with iodine values of not greater than 100, and semidrying oils with iodine values of greater than 100 and less than 130, or drying oils with iodine values of 130 or greater. Examples of non-drying oils include olive oil, morning glory seed oil, cashew fruit oil, sasanqua oil, camellia oil, castor oil and peanut oil. Examples of semidrying oils include corn oil, cottonseed oil and sesame oil. Examples of drying oils include paulownia oil, linseed oil, soybean oil, walnut oil, safflower oil, sunflower oil, perilla oil and mustard seed oil. Processed vegetable oils obtained by processing of these vegetable oils may also be used.

From the viewpoint of preventing gelling that occurs with excessive reaction occurring during the reaction between the phenol or its derivative or the phenol resin and a vegetable oil, and improving yield, it is preferred to use a non-drying oil among the vegetable oils mentioned above. On the other hand, a drying oil is preferably used from the viewpoint of improving the adhesiveness, mechanical properties and thermal shock resistance of the resist pattern. Among drying oils, paulownia oil, linseed oil, soybean oil, walnut oil and safflower oil are preferred, and paulownia oil and linseed oil are more preferred, because they can more effectively and reliably exhibit the effect of the invention.

These unsaturated hydrocarbon group-containing compounds may be used alone or in combinations of two or more.

For preparation of component (A2), first the phenol derivative and the unsaturated hydrocarbon group-containing compound are reacted to form an unsaturated hydrocarbon group-modified phenol derivative. The reaction is preferably conducted at 50-130° C. From the viewpoint of improving the flexibility of the cured film (resist pattern), the reaction ratio between the phenol derivative and unsaturated hydrocarbon group-containing compound is preferably 1-100 parts by mass and more preferably 5-50 parts by mass of the unsaturated hydrocarbon group-containing compound with respect to 100 parts by mass of the phenol derivative. If the unsaturated hydrocarbon group-containing compound is used at less than 1 part by mass, the flexibility of the cured film tends to be reduced, and if it is used at greater than 100 parts by mass, the heat resistance of the cured film tends to be reduced. A catalyst such as p-toluenesulfonic acid or trifluoromethanesulfonic acid may be used if necessary in the reaction.

Polycondensation between the unsaturated hydrocarbon group-modified phenol derivative produced by this reaction and an aldehyde produces a phenol resin modified by the unsaturated hydrocarbon group-containing compound. The aldehyde used may be any of the same ones mentioned above as aldehydes to be used to obtain the phenol resin.

The reaction between the aldehyde and the unsaturated hydrocarbon group-modified phenol derivative is a polycondensation reaction, and conventionally known phenol resin synthesis conditions may be employed. The reaction is preferably conducted in the presence of a catalyst such as an acid or base, and more preferably using an acid catalyst. Examples of acid catalysts include hydrochloric acid, sulfuric acid, formic acid, acetic acid, p-toluenesulfonic acid and oxalic acid. These acid catalysts may be used alone or in combinations of two or more.

The reaction is preferably conducted at an ordinary reaction temperature of 100-120° C. The reaction time will differ depending on the type and amount of catalyst used, but for most purposes it will be 1-50 hours. Upon completion of the reaction, the reaction product is subjected to dehydration at reduced pressure at a temperature of not higher than 200° C. to obtain a phenol resin modified by an unsaturated hydrocarbon group-containing compound. A solvent such as toluene, xylene or methanol may be used for the reaction.

A phenol resin modified by an unsaturated hydrocarbon group-containing compound may also be obtained by polycondensation of the aforementioned unsaturated hydrocarbon group-modified phenol derivative with an aldehyde, together with a compound other than a phenol, such as m-xylene. In this case, the molar ratio of the compound other than a phenol is preferably less than 0.5 with respect to the compound obtained by reaction of the phenol derivative and the unsaturated hydrocarbon group-containing compound.

Component (A2) may also be obtained by reacting the phenol resin of component (A1) with an unsaturated hydrocarbon group-containing compound.

The unsaturated hydrocarbon group-containing compound to be reacted with the phenol resin may be any of the same unsaturated hydrocarbon group-containing compounds mentioned above.

The reaction between the phenol resin and unsaturated hydrocarbon group-containing compound is preferably conducted at 50-130° C., for most cases. From the viewpoint of improving the flexibility of the cured film (resist pattern), the reaction ratio between the phenol resin and the unsaturated hydrocarbon group-containing compound is preferably 1-100 parts by mass, more preferably 2-70 parts by mass and even more preferably 5-50 parts by mass of the unsaturated hydrocarbon group-containing compound with respect to 100 parts by mass of the phenol resin. If the unsaturated hydrocarbon group-containing compound is used at less than 1 part by mass, the flexibility of the cured film tends to be reduced, and if it is used at greater than 100 parts by mass, the potential for gelling during reaction tends to be increased and the heat resistance of the cured film tends to be reduced. A catalyst such as p-toluenesulfonic acid or trifluoromethanesulfonic acid may be used if necessary during the reaction. A solvent such as toluene, xylene, methanol or tetrahydrofuran may be used for the reaction.

As component (A2) there may also be used a phenol resin that has been acid-modified by further reacting a polybasic acid anhydride with phenolic hydroxyl groups remaining in the phenol resin modified by the unsaturated hydrocarbon group-containing compound produced by a method described above. Acid modification with a polybasic acid anhydride introduces carboxy groups and yet further improves the solubility of component (A2) in aqueous alkali solutions (developing solutions).

The polybasic acid anhydride is not particularly restricted so long as it has acid anhydride groups formed by dehydrating condensation of the carboxy groups of a polybasic acid having multiple carboxy groups. Examples of polybasic acid anhydrides include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and trimellitic anhydride, and aromatic tetrabasic acid dianhydrides such as biphenyl tetracarboxylic acid dianhydrides, naphthalene tetracarboxylic acid dianhydrides, diphenyl ether tetracarboxylic acid dianhydrides, butane tetracarboxylic acid dianhydrides, cyclopentane tetracarboxylic acid dianhydrides, pyromellitic anhydride and benzophenone tetracarboxylic acid dianhydrides. These compounds may be used alone or in combinations of two or more. The polybasic acid anhydride is preferably a dibasic acid anhydride among those mentioned above, and is more preferably one or more selected from the group consisting of tetrahydrophthalic anhydride, succinic anhydride and hexahydrophthalic anhydride. This is advantageous as it will allow formation of a resist pattern with a more satisfactory shape.

The reaction between the phenolic hydroxyl groups and polybasic acid anhydride may be conducted at 50-130° C. The polybasic acid anhydride is preferably reacted at 0.1-0.8 mol, more preferably 0.15-0.6 mol and even more preferably 0.2-0.4 mol to 1 mol of the phenolic hydroxyl groups. If the polybasic acid anhydride is reacted at less than 0.1 mol, the developability tends to be reduced, and at greater than 0.8 mol the alkali resistance of the unexposed sections tends to be reduced.

A catalyst may be added during the reaction, as necessary from the viewpoint of speeding the reaction. Catalysts include tertiary amines such as triethylamine, quaternary ammonium salts such as triethylbenzylammonium chloride, imidazole compounds such as 2-ethyl-4-methylimidazole and phosphorus compounds such as triphenylphosphine.

The acid value of the phenol resin further modified by a polybasic acid anhydride is preferably 30-200 mgKOH/g, more preferably 40-170 mgKOH/g and even more preferably 50-150 mgKOH/g. If the acid value is less than 30 mgKOH/g, a longer time tends to be required for alkali development than if the acid value is within the specified range, and if it exceeds 200 mgKOH/g the developing solution resistance of the unexposed sections tends to be lower than if the acid value is within the specified range.

The molecular weight of component (A1) according to the invention, in terms of weight-average molecular weight, is preferably 500-150,000, more preferably 500-100,000 and even more preferably 1,000-50,000, in consideration of solubility in aqueous alkali solutions, and balance between the photosensitive properties (sensitivity and resolution) and mechanical properties (breaking elongation, elastic modulus and residual stress).

The molecular weight of the phenol resin modified with an unsaturated hydrocarbon group (A2), in terms of weight-average molecular weight, is preferably 1,000-500,000, more preferably 2,000-200,000, even more preferably 2,000-100,000 and most preferably 5,000-50,000, in consideration of solubility in aqueous alkali solutions and balance between photosensitive properties and cured film properties. The weight-average molecular weight referred to here is the value obtained by measurement by gel permeation chromatography and calculation using a standard polystyrene calibration curve.

From the viewpoint of sensitivity and resolution for formation of a resist pattern, and the adhesiveness, mechanical properties and thermal shock resistance of the cured resist pattern, when the positive tone photosensitive composition employs both a phenol resin having no unsaturated hydrocarbon group or a hydroxystyrene-based resin (A1) and a phenol resin modified with an unsaturated hydrocarbon group (A2) as component (A), the ratio $M_{A1}/M_{A2}$ of the mass $M_{A1}$ of component (A1) and the mass $M_{A2}$ of component (A2) is preferably 5/95-95/5, more preferably 10/90-90/10 and most preferably 15/85-85/15.

The (A) alkali-soluble resin having a phenolic hydroxyl group may contain a phenol resin that has additionally been acid-modified by reaction with a polybasic acid anhydride. If component (A) contains a phenol resin that has been acid-modified with a polybasic acid anhydride, the solubility of component (A) in aqueous alkali solutions (developing solutions) will be further improved.

Examples for the polybasic acid anhydride include dibasic acid anhydrides such as phthalic anhydride, succinic anhydride, octenylsuccinic anhydride, pentadodecenylsuccinic anhydride, maleic anhydride, itaconic anhydride, tetrahydrophthalic anhydride, hexahydrophthalic anhydride, methyltetrahydrophthalic anhydride, methylhexahydrophthalic anhydride, nadic anhydride, 3,6-endomethylenetetrahydrophthalic anhydride, methylendomethylenetetrahydrophthalic anhydride, tetrabromophthalic anhydride and trimellitic anhydride, and aliphatic and aromatic tetrabasic acid dianhydrides such as biphenyl tetracarboxylic acid dianhydrides, naphthalene tetracarboxylic acid dianhydrides, diphenyl ether tetracarboxylic acid dianhydrides, butane tetracarboxylic acid dianhydrides, cyclopentane tetracarboxylic acid dianhydrides, pyromellitic anhydride and benzophenone tetracarboxylic acid dianhydrides. These compounds may be used alone or in combinations of two or more. Dibasic acid anhydrides are preferred polybasic acid anhydrides among the above, and more preferred are one or more selected from the group consisting of tetrahydrophthalic anhydride, succinic anhydride and hexahydrophthalic anhydride, for example.

The reaction may be conducted at 50-130° C. In the reaction, the polybasic acid anhydride is preferably reacted at 0.10-0.80 mol, more preferably at 0.15-0.60 mol and most preferably at 0.20-0.40 mol with respect to 1 mol of phenolic hydroxyl groups.

A catalyst may be added during the reaction, as necessary from the viewpoint of speeding the reaction. Catalysts include tertiary amines such as triethylamine, quaternary ammonium salts such as triethylbenzylammonium chloride, imidazole compounds such as 2-ethyl-4-methylimidazole and phosphorus compounds such as triphenylphosphine.

<Component (B)>

The compound that produces an acid by light, as component (B), may be a photosensitive agent. Such a component (B) has the function of producing an acid under photoirradiation, and increasing the solubility of the photoirradiated sections in the aqueous alkali solution. Component (B) may be a compound commonly known as a photoacid generator. Specific examples for component (B) include o-quinonediazide compounds, aryldiazonium salts, diaryliodonium salts, triarylsulfonium salts and the like. Preferred among these are o-quinonediazide compounds, for their high sensitivity.

Examples of o-quinonediazide compounds that may be used include those obtainable by condensation reaction between o-quinonediazidesulfonyl chloride and a hydroxy compound or amino compound, in the presence of a dehydrochlorinating agent.

The o-quinonediazidesulfonyl chloride used for the reaction may be, for example, benzoquinone-1,2-diazide-4-sulfonyl chloride, naphthoquinone-1,2-diazide-5-sulfonyl chloride or naphthoquinone-1,2-diazide-4-sulfonyl chloride.

Examples of hydroxy compounds to be used in the reaction include hydroquinone, resorcinol, pyrogallol, bisphenol A, bis(4-hydroxyphenyl)methane, 1,1-bis(4-hydroxyphenyl)-1-[4-{1-(4-hydroxyphenyl)-1-methylethyl}phenyl]ethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and tris(4-hydroxyphenyl)ethane.

Examples of amino compounds to be used in the reaction include p-phenylenediamine, m-phenylenediamine, 4,4'-diaminodiphenyl ether, 4,4'-diaminodiphenylmethane, 4,4'-diaminodiphenylsulfone, 4,4'-diaminodiphenyl sulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane and bis(4-amino-3-hydroxyphenyl)hexafluoropropane.

The dehydrochlorinating agent used in the reaction may be sodium carbonate, sodium hydroxide, sodium hydrogencarbonate, potassium carbonate, potassium hydroxide, trimethylamine, triethylamine, pyridine, or the like. The reaction solvent used may be dioxane, acetone, methyl ethyl ketone, tetrahydrofuran, diethyl ether, N-methylpyrrolidone or the like.

The o-quinonediazidesulfonyl chloride and the hydroxy compound and/or amino compound are preferably added in amounts such that the total number of moles of hydroxy groups and amino groups is 0.5-1 with respect to 1 mol of o-quinonediazidesulfonyl chloride. A preferred mixing proportion for the dehydrochlorinating agent and o-quinonediazidesulfonyl chloride is in the range of between 0.95/1 mol equivalents and 1/0.95 mol equivalents.

The preferred reaction temperature for the reaction is 0-40° C. and the preferred reaction time is 1-10 hours.

The amount of component (B) added is preferably 3-100 parts by mass, more preferably 5-50 parts by mass and most preferably 5-30 parts by mass with respect to 100 parts by mass of component (A), from the viewpoint of obtaining acceptable ranges for the difference in the dissolution rates of the exposed sections and unexposed sections, and for sensitivity.

<Component (C)>

By adding a thermal crosslinking agent as component (C), the component (C) will react with component (A) to form a crosslinking structure when the photosensitive resin film is heated and cured after pattern formation. This will allow curing at low temperature, and can prevent brittleness of the film or melting of the film. Preferred compounds to be used for component (C) include, specifically, compounds having phenolic hydroxyl groups, compounds having hydroxymethylamino groups and compounds having epoxy groups.

Here, the term "compounds having phenolic hydroxyl groups" does not include alkali-soluble resins having phenolic hydroxyl groups (A). A compound having a phenolic hydroxyl group used as a thermal crosslinking agent not only serves as a thermal crosslinking agent but can also both increase the dissolution rate of the exposed sections during development with an aqueous alkali solution, and improve the sensitivity. The molecular weight of the compound having a phenolic hydroxyl group is preferably not greater than 2000. In consideration of solubility in the aqueous alkali solution and balance between photosensitive properties and mechanical properties, the number-average molecular weight is preferably 94-2000, more preferably 108-2000 and most preferably 108-1500.

A known compound may be used as the compound having a phenolic hydroxyl group, but compounds represented by the following formula (5) are especially preferred for an excellent balance between dissolution-accelerating effect at exposed sections, and anti-melting effect during curing of the photosensitive resin film.

[Chemical Formula 5]

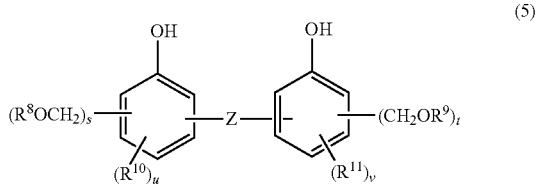

(5)

[In formula (5), Z represents a single bond or a divalent organic group, $R^{13}$, $R^{14}$, $R^{15}$ and $R^{16}$ each independently represents hydrogen atom or a monovalent organic group, s and t each independently represents an integer of 1-3, and u and v each independently represents an integer of 0-4.]

A compound of formula (5) in which Z is a single bond is a biphenol(dihydroxybiphenyl) derivative. The divalent organic group represented by Z may be a C1-C10 alkylene group such as methylene, ethylene or propylene, a C2-C10 alkylidene group such as ethylidene or a C6-C30 arylene group such as phenylene, or any of these hydrocarbon groups wherein some or all of the hydrogen atoms are replaced with halogen atoms such as fluorine atoms, or a sulfonyl group, carbonyl group, ether bond, thioether bond or amide bond group, or the like. Preferred among these are compounds wherein Z is a divalent organic group represented by the following formula (6).

[Chemical Formula 6]

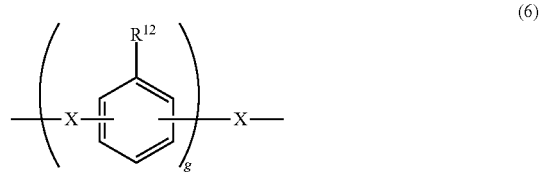

(6)

[In formula (6), X represents a single bond, an alkylene group (for example, a C1-C10 alkylene group), an alkylidene group (for example, a C2-C10 alkylidene group), any of these groups wherein some or all of the hydrogen atoms are replaced with halogen atoms, or a sulfonyl group, carbonyl group, ether bond, thioether bond or amide bond group. $R^{12}$ represents hydrogen atoms, hydroxyl group or an alkyl group or haloalkyl group, and g represents an integer of 1-10. When multiple $R^{12}$ groups are present, they may be the same or different.]

Compounds having hydroxymethylamino groups include nitrogen-containing compounds such as (poly)(N-hydroxymethyl)melamine, (poly)(N-hydroxymethyl)glycoluryl, (poly)(N-hydroxymethyl)benzoguanamine or (poly) (N-hydroxymethyl)urea in which some or all of the methylol groups have been alkyletherified. The alkyl groups of the alkyl ethers mentioned here may be methyl group, ethyl group, butyl group or mixtures thereof, and they may also contain partially self-condensed oligomer components. Specifically, there may be mentioned hexakis(methoxymethyl) melamine, hexakis(butoxymethyl)melamine, tetrakis(methoxymethyl)glycoluryl, tetrakis(butoxymethyl)glycoluryl and tetrakis(methoxymethyl)urea.

As compounds with epoxy groups there may be used conventionally known compounds. Specific examples include bisphenol A-type epoxy resins, bisphenol F-type epoxy resins, phenol-novolac-type epoxy resins, cresol-novolac-type epoxy resins, alicyclic epoxy resins, glycidylamines, heterocyclic epoxy resins and polyalkyleneglycol diglycidyl ethers.

In addition to the compounds mentioned above for component (C), there may be used aromatic compounds having hydroxymethyl groups, such as bis[3,4-bis(hydroxymethyl) phenyl]ether or 1,3,5-tris(1-hydroxy-1-methylethyl)benzene, compounds having maleimide groups, such as bis(4-maleimidephenyl)methane or 2,2-bis[4-(4'-maleimidephenoxy)phenyl]propane, compounds having norbornane skeletons, polyfunctional acrylate compounds, compounds having oxetanyl groups, compounds having vinyl groups, and blocked isocyanato compounds.

Among the compounds for component (C) mentioned above, from the viewpoint of improving sensitivity and heat resistance, the preferred compounds are those having phenolic hydroxyl groups and compounds having hydroxymethylamino groups, while from the viewpoint of also allowing further improvement in resolution and coating film coverage, the preferred compounds are those having hydroxymethylamino groups, the particularly preferred compounds are those having alkoxymethylamino groups wherein some or all of the hydroxymethylamino groups have been alkyletherified, and the most preferred compounds are those having alkoxymethylamino groups, wherein all of the hydroxymethylamino groups have been alkyletherified.

Particularly preferred among compounds having alkoxymethylamino groups, wherein all of the aforementioned hydroxymethylamino groups have been alkyletherified, are compounds represented by the following formula (III).

[Chemical Formula 7]

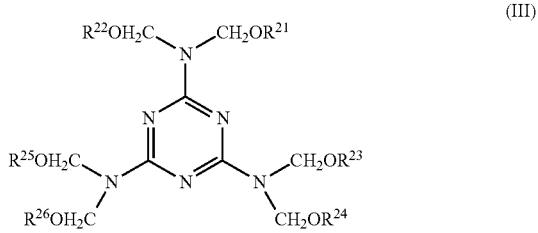

[In formula (III), $R^{21}$-$R^{26}$ each independently represents a C1-C10 alkyl group.]

The amount of component (C) added is preferably 1-50 parts by mass, more preferably 2-30 parts by mass and most preferably 3-25 parts by mass with respect to 100 parts by mass of component (A), from the viewpoint of obtaining acceptable ranges for the developing time and the film residue rate at the unexposed sections, and from the viewpoint of the cured film properties. The aforementioned thermal crosslinking agents may be used as single compounds or as combinations of two or more.

<Component (D)>

By adding an acrylic resin as component (D) it is possible to maintain satisfactory photosensitive properties while improving the thermal shock resistance.

The acrylic resin is preferably an acrylic resin with one or more structural units represented by the following formulas (1)-(3).

[Chemical Formula 8]

[Chemical Formula 9]

[Chemical Formula 10]

[In formulas (1)-(3), $R^1$ represents hydrogen atom or a methyl group, $R^2$ represents a C4-C20 alkyl group, and $R^3$ represents a monovalent organic group with a primary, secondary or tertiary amino group.]

Adding an acrylic resin having a structural unit represented by formula (1) and a structural unit represented by formula (2) is more preferred since this will allow satisfactory photosensitive properties to be maintained while improving thermal shock resistance, while from the viewpoint of compatibility with component (A), adhesiveness of the resist pattern to substrates and allowing further improvement in the mechanical properties and thermal shock resistance, it is more preferred to add an acrylic resin having a structural unit represented by formula (1), a structural unit represented by formula (2) and a structural unit represented by formula (3). Component (D) may consist of a single acrylic resin, or it may contain two or more.

When the acrylic resin has a structural unit represented by formula (1), $R^1$ is preferably a C4-C16 alkyl group and more preferably a C4 alkyl group (n-butyl group), from the viewpoint of allowing improved sensitivity, resolution and thermal shock resistance. Alkyl(meth)acrylate esters may be mentioned as polymerizable monomers that can provide structural units represented by formula (1).

Examples of alkyl(meth)acrylate esters include compounds represented by the following formula (7).

In formula (7), $R^1$ represents hydrogen atom or a methyl group, and $R^2$ represents a C4-C20 alkyl group. Examples of C1-C20 alkyl groups represented by $R^2$ include butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group, and their structural isomers. Examples of polymerizable monomers represented by formula (7) include butyl (meth)acrylate ester, pentyl(meth)acrylate ester, hexyl(meth)acrylate ester, heptyl(meth)acrylate ester, octyl(meth)acrylate ester, nonyl(meth)acrylate ester, decyl(meth)acrylate ester, undecyl(meth)acrylate ester, dodecyl(meth)acrylate ester, tridecyl(meth)acrylate ester, tetradecyl(meth)acrylate ester, pentadecyl(meth)acrylate ester, hexadecyl(meth)acrylate ester, heptadecyl(meth)acrylate ester, octadecyl(meth)acrylate ester, nonadecyl(meth)acrylate ester and eicosyl(meth)acrylate ester. These polymerizable monomers may be used as alone or in combinations of two or more.

Polymerizable monomers that can provide structural units represented by formula (2) include acrylic acid and methacrylic acid.

Examples of polymerizable monomers that can provide structural units represented by formula (3) include aminoethyl(meth)acrylate, N-methylaminoethyl(meth)acrylate, N,N-dimethylaminoethyl(meth)acrylate, N-ethylaminoethyl (meth)acrylate, N,N-diethylaminoethyl(meth)acrylate, aminopropyl(meth)acrylate, N-methylaminopropyl(meth)acrylate, N,N-dimethylaminopropyl(meth)acrylate, N-ethylaminopropyl(meth)acrylate, N,N-diethylaminopropyl(meth)acrylate, aminoethyl(meth)acrylamide, N-methylaminoethyl(meth)acrylamide, N,N-dimethylaminoethyl(meth)acrylamide, N-ethylaminoethyl(meth)acrylamide, N,N-diethylaminoethyl(meth)acrylamide, aminopropyl(meth)acrylamide, N-methylaminopropyl(meth)acrylamide, N,N-dimethylaminopropyl(meth)acrylamide, N-ethylaminopropyl(meth)acrylamide, N,N-diethylaminopropyl(meth)acrylamide, piperidin-4-yl(meth)acrylate, 1-methylpiperidin-4-yl(meth)acrylate, 2,2,6,6-tetramethylpiperidin-4-yl(meth)acrylate, 1,2,2,6,6-pentamethylpiperidin-4-yl(meth)acrylate, (piperidin-4-yl)methyl(meth)acrylate and 2-(piperidin-4-yl)ethyl(meth)acrylate. These polymerizable monomers may be used alone or in combinations of two or more. From the viewpoint of allowing further improvement in adhesiveness of the resist pattern to substrates, mechanical properties and thermal shock resistance, there are particularly preferred compounds of formula (3) wherein $R^3$ is a monovalent organic group represented by the following formula (8).

[Chemical Formula 11]

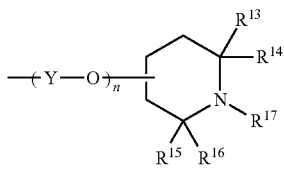

(8)

[In formula (8), Y represents a C1-C5 alkylene group, $R^{13}$-$R^{17}$ each independently represent hydrogen atom or a C1-C20 alkyl group, and n is an integer of 0-10.]

Examples of polymerizable monomers that can provide structural units of formula (3) wherein $R^3$ represents a monovalent organic group represented by formula (8), include piperidin-4-yl(meth)acrylate, 1-methylpiperidin-4-yl(meth)acrylate, 2,2,6,6-tetramethylpiperidin-4-yl(meth)acrylate, 1,2,2,6,6-pentamethylpiperidin-4-yl(meth)acrylate, (piperidin-4-yl)methyl(meth)acrylate and 2-(piperidin-4-yl)ethyl(meth)acrylate. Among these, 1,2,2,6,6-pentamethylpiperidin-4-yl methacrylate is commercially available as FA-711 mM, and 2,2,6,6-tetramethylpiperidin-4-yl methacrylate is commercially available as FA-712HM (both products of Hitachi Chemical Co., Ltd.).

The compositional ratio of the structural unit represented by formula (1) in the acrylic resin of component (D) is preferably 50-95% by mass, more preferably 60-90% by mass and most preferably 70-85% by mass, based on the total amount of component (D). A compositional ratio of 50-95% by mass for the structural unit represented by formula (1) can further improve the thermal shock resistance of the cured film of the positive tone photosensitive composition.

Also, the compositional ratio of the structural unit represented by formula (2) in the acrylic resin of component (D) is preferably 5-35% by mass, more preferably 10-30% by mass and most preferably 15-25% by mass, based on the total amount of component (D). A compositional ratio of 5-35% by mass for the structural unit represented by formula (2) can further improve the compatibility with component (A), as well as the developability of the positive tone photosensitive composition.

The (D) acrylic resin more preferably has a structural unit represented by formulas (1) and (2) and a structural unit represented by formula (3), from the viewpoint of further improving the compatibility with component (A), the adhesiveness of the resist pattern for substrates and the mechanical properties and thermal shock resistance. If the structural unit of the (D) acrylic resin is such a combination, the interaction between the (D) acrylic resin and the (A) alkali-soluble resin having a phenolic hydroxyl group will be satisfactory, and the compatibility will be greater.

When a structural unit represented by formula (3) is used, the compositional ratio in the acrylic resin of component (D) is preferably 0.3-10% by mass, more preferably 0.4-6% by mass and most preferably 0.5-5% by mass, based on the total amount of component (D).

The (D) acrylic resin preferably has a structural unit represented by the following formula (9), from the viewpoint of further increased sensitivity.

[Chemical Formula 12]

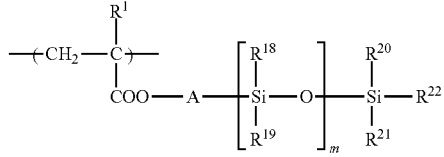

(9)

[In formula (9), $R^1$ represents hydrogen atom or a methyl group, A represents a C1-C5 alkylene group, $R^{18}$-$R^{22}$ each independently represents a C1-C6 alkyl group, and m represents an integer of 1-100.]

The polymerizable monomer that provides a structural unit represented by formula (9) may be, for example, a methacryl-modified silicone oil, which is commercially available as X-22-174DX, X-22-2426 or X-22-2475 (all products of Shin-Etsu Chemical Co., Ltd.).

When a structural unit represented by formula (9) is used, the compositional ratio in the acrylic resin of component (D) is preferably 1-10% by mass, more preferably 2-5% by mass and most preferably 3-5% by mass, based on the total amount of component (D).

The (D) acrylic resin of the invention may be synthesized with addition of a polymerizable monomer other than polymerizable monomers that provide structural units represented by formula (1), formula (2), formula (3) and formula (9).

Examples of such polymerizable monomers include vinyl alcohol esters such as styrene, α-methylstyrene, benzyl(meth)acrylate ester, 4-methylbenzyl(meth)acrylate ester, 2-hydroxyethyl(meth)acrylate ester, 2-hydroxypropyl(meth)acrylate ester, 3-hydroxypropyl(meth)acrylate ester, 4-hydroxybutyl(meth)acrylate ester, acrylonitrile and vinyl-n-butyl ether, tetrahydrofurfuryl(meth)acrylate ester, glycidyl(meth)acrylate ester, 2,2,2-trifluoroethyl(meth)acrylate, 2,2,3,3-tetrafluoropropyl(meth)acrylate, (meth)acrylic acid, α-bromo(meth)acrylic acid, α-chlor(meth)acrylic acid, β-furyl(meth)acrylic acid, β-styryl(meth)acrylic acid, maleic acid, maleic anhydride, maleic acid monoesters such as monomethyl malate, monoethyl malate and monoisopropyl malate, and fumaric acid, cinnamic acid, α-cyanocinnamic acid, itaconic acid, crotonic acid, propiolic acid and the like. These polymerizable monomers may be used alone or in combinations of two or more.

The weight-average molecular weight of component (D) is preferably 2,000-100,000, more preferably 3,000-60,000, even more preferably 5,000-50,000 and most preferably 10,000-40,000. If the weight-average molecular weight is less than 2,000, the thermal shock resistance of the cured film tends to be lowered, and if it exceeds 100,000, the compatibility with component (A) and the developability tend to be reduced.

The content of component (D) is preferably 1-50 parts by mass, more preferably 3-30 parts by mass and most preferably 5-20 parts by mass with respect to 100 parts by mass as the total of component (A), from the viewpoint of adhesiveness, mechanical properties, thermal shock resistance and photosensitive properties.

<Component (E) (Compound that Produces an Acid by Heat)>

The positive tone photosensitive composition preferably further comprises (E) a compound that produces an acid by heat. Using component (E) can prevent melting of the pattern. This allows an acid to be generated during heating of the photosensitive resin film after development, so that the reaction between component (A) and component (C), i.e. the thermal crosslinking reaction, will initiate from a lower temperature, thus improving the heat resistance of the cured film and inhibiting melting of the pattern. Also, since most compounds that generate acids by heat can generate acids by photoirradiation as well, their use can increase the solubility of the exposed sections in aqueous alkali solution. The difference in solubilities of the unexposed sections and exposed sections for the aqueous alkali solution will therefore be increased, thus improving the resolution. According to the invention, however, a different compound from component (B) is used as component (E).

The compound that produces an acid by heat is preferably a compound that produces an acid by heat at a temperature of, for example, 50-250° C. (more preferably 50-200° C.). Specific examples for the compound that produces an acid by heat include compounds different from the compound that produces an acid by light for component (B), which may be a salt derived from a strong acid and a base, such as an onium salt having the function of producing an acid by heat, or an imidosulfonate.

Examples of onium salts include diaryliodonium salts such as aryldiazonium salts and diphenyl)iodonium salts; di(alkylaryl)iodonium salts such as di(t-butylphenyl)iodonium salts; trialkylsulfonium salts such as trimethylsulfonium salts; dialkylmonoarylsulfonium salts such as dimethylphenylsulfonium salts; diarylmonoalkyliodonium salts such as diphenylmethylsulfonium salts, and triarylsulfonium salts.

Preferred among these are di(t-butylphenyl)iodonium salt of para-toluenesulfonic acid, di(t-butylphenyl)iodonium salt of trifluoromethanesulfonic acid, trimethylsulfonium salt of trifluoromethanesulfonic acid, dimethylphenylsulfonium salt of trifluoromethanesulfonic acid, diphenylmethylsulfonium salt of trifluoromethanesulfonic acid, di(t-butylphenyl)iodonium salt of nonafluorobutanesulfonic acid, diphenyliodonium salt of camphorsulfonic acid, diphenyliodonium salt of ethanesulfonic acid, dimethylphenylsulfonium salt of benzenesulfonic acid and diphenylmethylsulfonium salt of toluenesulfonic acid.

Sulfonium salts represented by the following formula (4) are more preferred, with trialkylsulfonium salts of methanesulfonic acid being even more preferred and the trimethylsulfonium salt being especially preferred.

[Chemical Formula 13]

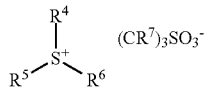

(4)

[In formula (4), $R^4$, $R^5$ and $R^6$ each independently represents an alkyl group or aryl group, and $R^7$ represents hydrogen atom or fluorine atom.]

Preferred as aryl groups are phenyl groups or substituted phenyl groups.

The salt formed from a strong acid and a base may also be, in addition to any of the aforementioned onium salts, a salt formed from any of the following strong acids and bases, such as a pyridinium salt. Strong acids include arylsulfonic acids such as p-toluenesulfonic acid and benzenesulfonic acid, perfluoroalkylsulfonic acids such as camphorsulfonic acid, trifluoromethanesulfonic acid and nonafluorobutanesulfonic acid, and alkylsulfonic acids such as methanesulfonic acid, ethanesulfonic acid and butanesulfonic acid. Bases include alkylpyridines such as pyridine and 2,4,6-trimethylpyridine and N-alkylpyridines or halogenated-N-alkylpyridines such as 2-chloro-N-methylpyridine.

Examples of imidosulfonates to be used include naphthoylimidosulfonates and phthalimidosulfonates.

For the compound that produces an acid by heat, there may also be used, in addition to the compounds mentioned above, a compound with a structure represented by the following formula (10), and compounds with a sulfonamide structure represented by the following formula (11).

$$R^{23}R^{24}C=N-O-SO_2-R^{25} \quad (10)$$

$$-NH-SO_2-R^{26} \quad (11)$$

In formula (10), $R^{23}$ is a cyano group, for example, and $R^{24}$ is a methoxyphenyl group or phenyl group, for example. Also, $R^{25}$ is an aryl group such as p-methylphenyl group or phenyl group, an alkyl group such as methyl group, ethyl group or isopropyl group, or a perfluoroalkyl group such as trifluoromethyl or nonafluorobutyl, for example.

In formula (11), $R^{26}$ is an alkyl group such as methyl group, ethyl group or propyl group, an aryl group such as methylphenyl group or phenyl group or a perfluoroalkyl group such as trifluoromethyl group or nonafluorobutyl group, for example. Examples of groups that bond to the N-atom of a sulfonamide structure represented by formula (11) include 2,2'-bis(4-hydroxyphenyl)hexafluoropropane and 2,2'-bis(4-hydroxyphenyl)propane, di(4-hydroxyphenyl)ether.

The content of the compound that produces an acid by heat, when it is used, is preferably 0.1-30 parts by mass, more preferably 0.15-20 parts by mass, even more preferably 0.2-20 parts by mass, particularly preferably 0.2-10 parts by mass and most preferably 0.5-10 parts by mass, with respect to 100 parts by mass of component (A).

<Component (F) (Elastomer)>

An elastomer may also be used in combination, according to the invention. The obtained resist pattern will thus be even more superior in terms of flexibility, and the mechanical properties and thermal shock resistance of the resist pattern will be able to be further improved. The elastomer that is used may be a known one, but the glass transition temperature (Tg) of the polymer composing the elastomer is preferably not higher than 20° C.

Examples of such elastomers include styrene-based elastomers, olefin-based elastomers, urethane-based elastomers, polyester-based elastomers, polyamide-based elastomers and silicone-based elastomers. The elastomer may also be a fine particulate elastomer. Such elastomers may be used alone or in combinations of two or more.

A solvent may be used in the positive tone photosensitive composition of the invention. By containing a solvent, an effect will be exhibited whereby it will be easier to coat the positive tone photosensitive composition of the invention onto the substrate, and it will be possible to obtain a coating film of uniform thickness. Examples of solvents include γ-butyrolactone, ethyl lactate, propyleneglycol monomethyl ether acetate, benzyl acetate, n-butyl acetate, ethoxyethyl propionate, 3-methylmethoxy propionate, N-methyl-2-pyrrolidone, N,N-dimethylformamide, N,N-dimethylacetamide, dimethyl sulfoxide, hexamethylphosphorylamide, tetramethylenesulfone, diethyl ketone, diisobutyl ketone, methyl amyl ketone, cyclohexanone, propyleneglycol monomethyl ether, propyleneglycol monopropyl ether, propyleneglycol monobutyl ether and dipropyleneglycol monomethyl ether. Any of these solvents may be used alone or in combinations of two or more.

When a solvent is used, its content is not particularly restricted, but the proportion of solvent in the positive tone photosensitive composition is preferably adjusted to 20-90% by mass.

<Other Components>

The positive tone photosensitive composition may also contain, in addition to components (A)-(F) and a solvent, other components such as dissolution accelerators, dissolution inhibitors, coupling agents, surfactants or leveling agents.

(Dissolution Accelerator)

By adding a dissolution accelerator to the positive tone photosensitive composition, it is possible to increase the dissolution rate at the exposed sections during development with an aqueous alkali solution, and to improve the sensitivity and resolution. Any conventionally known dissolution accelerator may be used. Specific examples include compounds with carboxyl groups, sulfonic acid and sulfonamide groups.

When such a dissolution accelerator is used, its content may be determined by the dissolution rate in the aqueous alkali solution, and for example, it may be 0.01-30 parts by mass with respect to 100 parts by mass of component (A).

(Dissolution Inhibitor)

A dissolution inhibitor is a compound that inhibits solubility of component (A) in the aqueous alkali solution, and it is used to control the residual film thickness, the developing time and the contrast. Specific examples include diphenyliodonium nitrate, bis(p-tert-butylphenyl)iodonium nitrate, diphenyliodonium bromide, diphenyliodonium chloride and diphenyliodonium iodide. When a dissolution inhibitor is used, its content is preferably 0.01-20 parts by mass, more preferably 0.01-15 parts by mass and most preferably 0.05-10 parts by mass with respect to 100 parts by mass of component (A), from the viewpoint of sensitivity and the allowable range for the developing time.

(Coupling Agent)

By adding a coupling agent to the positive tone photosensitive composition, it is possible to increase the adhesion of the formed cured film for the substrate. Examples of coupling agents include organosilane compounds and aluminum chelate compounds.

Examples of organosilane compounds include vinyltriethoxysilane, γ-glycidoxypropyltriethoxysilane, γ-methacryloxypropyltrimethoxysilane, ureapropyltriethoxysilane, methylphenylsilanediol, ethylphenylsilanediol, n-propylphenylsilanediol, isopropylphenylsilanediol, n-butyldiphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, isobutylmethylphenylsilanol, tert-butylmethylphenylsilanol, ethyl-n-propylphenylsilanol, ethylisopropylphenylsilanol, n-butylethylphenylsilanol, isobutylethylphenylsilanol, tert-butylethylphenylsilanol, methyldiphenylsilanol, ethyldiphenylsilanol, n-propyldiphenylsilanol, isopropyldiphenylsilanol, n-butyldiphenylsilanol, isobutyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, 1,4-bis(dibutylhydroxysilyl)benzene and 3-bis(2-hydroxyethyl)aminopropyltriethoxysilane.

The amount of coupling agent added is preferably 0.1-20 parts by mass and more preferably 0.5-10 parts by mass with respect to 100 parts by mass of component (A).

(Surfactant or Leveling Agent)

Addition of a surfactant or leveling agent to the positive tone photosensitive composition can improve the coatability, prevent striation (film thickness irregularities) and improve the developability. Examples of such surfactants or leveling agents include polyoxyethylene lauryl ether, polyoxyethylene stearyl ether, polyoxyethylene oleyl ether and polyoxyethylene octylphenol ether. Commercial products include MEGAFACE F171, F173 and R-08 (trade names of Dainippon Ink and Chemicals, Inc.), FLUORAD FC430 and FC431 (trade names of Sumitomo 3M), and the organosiloxane polymers KP341, KBM303, KBM403 and KBM803 (trade names of Shin-Etsu Chemical Co., Ltd.).

The total amount of surfactant/leveling agent used is preferably 0.001-5 parts by mass and more preferably 0.01-3 parts by mass with respect to 100 parts by mass of component (A).

The positive tone photosensitive composition may be developed using an aqueous alkali solution such as tetramethylammonium hydroxide (TMAH). By using the positive tone photosensitive composition described above, it is possible to form a resist pattern with sufficiently high sensitivity and resolution, as well as satisfactory adhesiveness and thermal shock resistance.

[Method for Producing Resist Pattern]

A method for producing a resist pattern will now be explained. The method for producing a resist pattern according to the invention comprises a step of exposing a photosensitive resin film comprising the positive tone photosensitive composition described above, a step of developing the exposed photosensitive resin film with an aqueous alkali solution to form a pattern, and a step of heating the photosensitive resin film that has been formed into the pattern. Each of these steps will now be explained.

<Coating/Drying (Film-Forming) Step>

First, the positive tone photosensitive composition is coated onto a support substrate and dried to form a photosensitive resin film. In this step, first the positive tone photosensitive composition is spin coated onto a support substrate such as a glass panel, semiconductor, metal oxide insulator (for example, $TiO_2$ and $SiO_2$) or silicon nitride, using a spinner, to form a coating film. The support substrate on which the coating film has been formed is then dried using a hot plate, oven or the like. A photosensitive resin film is thus formed on the support substrate.

<Exposure Step>

In the subsequent exposure step, the photosensitive resin film formed on the support substrate is irradiated with active light rays such as ultraviolet rays, visible light rays or radiation, through a mask. Since component (A) in the positive tone photosensitive composition has high transparency for i-lines, irradiation with i-lines is preferably employed. After exposure, post-exposure baking (PEB) may be carried out if necessary. The temperature for post-exposure baking is preferably 70° C.-140° C., and the time for post-exposure baking is preferably 1-5 minutes.

<Developing Step>

In the developing step, the exposed sections of the photosensitive resin film after the exposure step are removed with a developing solution for patterning of the photosensitive resin film. Examples of developing solutions that may be suitably used include aqueous alkali solutions such as sodium hydroxide, potassium hydroxide, sodium silicate, ammonia, ethylamine, diethylamine, triethylamine, triethanolamine and tetramethylammonium hydroxide (TMAH). The base concentration of these aqueous solutions is preferably 0.1-10% by mass. An alcohol or surfactant may also be added to the developing solution for use. These may be added in ranges of preferably 0.01-10 parts by mass and more preferably 0.1-5 parts by mass each, with respect to 100 parts by mass of the developing solution.

<Heat Treatment Step>

In the subsequent heat treatment step, the patterned photosensitive resin film is subjected to heat treatment to allow formation of a resist pattern composed of the heated photosensitive resin film. The heating temperature in the heat treatment step is preferably not higher than 250° C., more preferably not higher than 225° C. and even more preferably 140-200° C., from the viewpoint of sufficiently preventing heat-induced damage to the electronic device.

The heat treatment may be carried out using an oven such as, for example, a quartz tube furnace, hot plate, rapid thermal annealing, vertical diffusion furnace, infrared curing furnace, electron beam curing furnace or microwave curing furnace. An atmosphere of air or an inert atmosphere of nitrogen or the like may be selected, but treatment under nitrogen is preferred as it can prevent oxidation of the pattern. Since the aforementioned preferred heating temperature range is lower than the conventional heating temperature, it is possible to minimize damage to the support substrate or electronic device. Thus, using the method for producing a resist pattern according to the invention allows high-yield production of electronic devices. This is also associated with energy savings for the process. Moreover, because the positive tone photosensitive composition of the invention exhibits a low degree of the volume shrinkage (cure shrinkage) in the heat treatment step that is observed with photosensitive polyimides and the like, it is possible to avoid reduction in dimensional precision.

The heat treatment time in the heat treatment step may be a time sufficient for the positive tone photosensitive composition to cure, but it is generally preferred to be no longer than 5 hours, for balance with working efficiency.

The heat treatment may be carried out in an oven as described above, or using a microwave curing apparatus or a frequency-variable microwave curing apparatus. By using such apparatuses it is possible to efficiently heat the photosensitive resin film alone while maintaining the temperature of the substrate or electronic device at not higher than 200° C., for example.

In a frequency-variable microwave curing apparatus, microwaves are irradiated in a pulse form while varying the frequency, and this is preferred since it can avoid standing waves and allows uniform heating of the substrate surface. When the substrate includes metal wiring, as in the electronic component described hereunder, irradiation of microwaves in a pulse form while varying the frequency is preferred as it can prevent discharge from the metal and can protect the electronic components from damage. Heating using frequency-variable microwaves is also preferred because the physical properties of the cured film will not be as impaired as when using an oven, even if the curing temperature is lowered (J. Photopolym. Sci. Technol., 18, 327-332 (2005)).

The frequency of the frequency-variable microwaves is in the range of 0.5-20 GHz, but in practice the range of 1-10 GHz is preferred, and the range of 2-9 GHz is more preferred. Also, the frequency of the irradiated microwaves is preferably varied in a continuous manner, although in actuality irradiation is conducted with stagewise variation in the frequency. Since a shorter time for irradiation of microwaves of a single frequency will tend to prevent standing waves or discharge from the metal, the exposure time is preferably no longer than 1 millisecond and especially no longer than 100 microseconds.

The irradiated microwave output will differ depending on the size of the apparatus and the volume of the object to be heated, but it will generally be in the range of 10-2000 W, and in practice it is more preferably 100-1000 W, particularly preferably 100-700 W and most preferably 100-500 W. With an output of lower than 10 W it will be difficult to heat the object in a short period of time, and with an output of higher than 2000 W the temperature increase will tend to be drastic, and therefore neither extreme is preferred.

The microwaves are preferably irradiated in a pulse form by on/off switching. Irradiation of the microwaves in a pulse form is preferred as it will allow the set heating temperature to be maintained and can prevent damage to the cured film or base material. The time for each pulse-form microwave irradiation will differ depending on the conditions, but for most cases it is preferably not longer than 10 seconds.

According to the method for producing a resist pattern as described above, it is possible to obtain a resist pattern with sufficiently high sensitivity and resolution, and satisfactory heat resistance.

[Semiconductor Device Production Steps]

The production steps for a semiconductor device will now be explained with reference to the attached drawings, as an example of a method for producing a resist pattern according to the invention. FIGS. 1 to 5 are simplified cross-sectional views showing an embodiment of the production steps for a semiconductor device with a multilayer wiring structure.

First, the structure 100 shown in FIG. 1 is prepared. The structure 100 comprises a semiconductor board 1 such as a Si substrate with a circuit element, a protective film 2 such as a silicon oxide film having a prescribed pattern in which the circuit element is exposed, and covering the semiconductor board 1, a first conductive layer 3 formed on the exposed circuit element, and an interlayer insulating film 4 composed of a polyimide resin, formed as a film on the protective film 2 and first conductive layer 3 by spin coating or the like.

Figure 2:
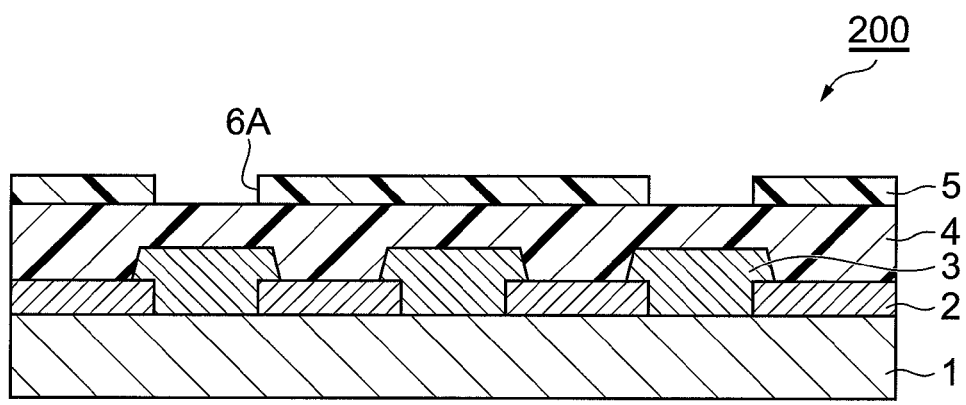
FIG. 2 is a simplified cross-sectional view for explanation of an embodiment of the production steps for a semiconductor device.

A photosensitive resin layer 5 having a window section 6A is then formed on the interlayer insulating film 4 to obtain the structure 200 shown in FIG. 2. The photosensitive resin layer 5 is formed, for example, by coating a photosensitive resin such as a chlorinated rubber-based, phenol-novolac-based, polyhydroxystyrene-based or polyacrylic acid ester-based resin by spin coating. The window section 6A is formed by a known photo engraving technique in such a manner that a prescribed section of the interlayer insulating film 4 is exposed.

Figure 3:
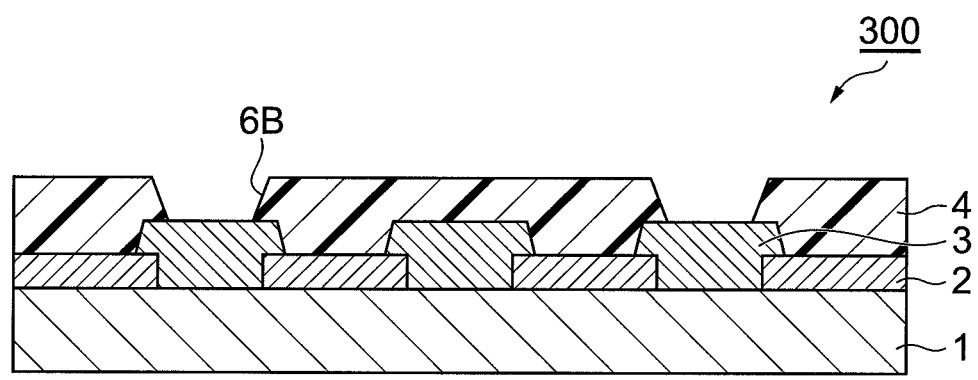
FIG. 3 is a simplified cross-sectional view for explanation of an embodiment of the production steps for a semiconductor device.

After the interlayer insulating film 4 has been etched to form the window section 6B, the photosensitive resin layer 5 is removed to obtain the structure 300 shown in FIG. 3. Dry etching means employing a gas such as oxygen or carbon tetrafluoride may be used for etching of the interlayer insulating film 4. The etching selectively removes the section of the interlayer insulating film 4 corresponding to the window section 6A, to obtain an interlayer insulating film 4 having the window section 6B formed in such a manner that the first conductive layer 3 is exposed. Next, an etching solution that erodes only the photosensitive resin layer 5 without eroding the first conductive layer 3 exposed through the window section 6B, is used to remove the photosensitive resin layer 5.

Figure 4:
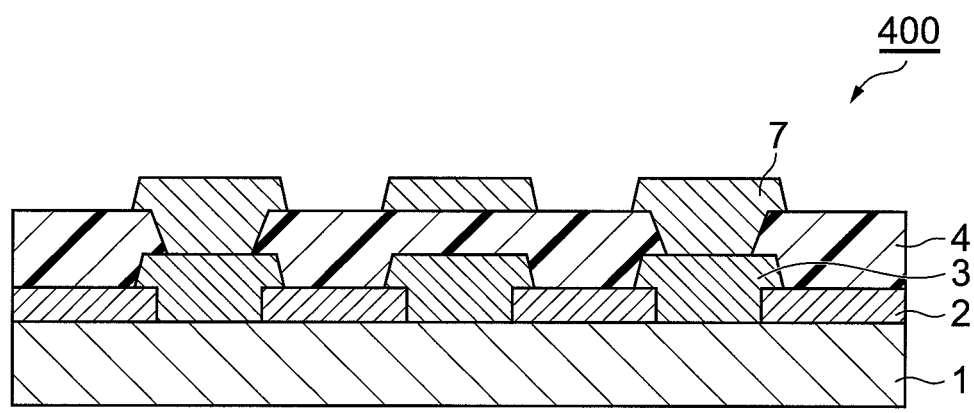
FIG. 4 is a simplified cross-sectional view for explanation of an embodiment of the production steps for a semiconductor device.

A second conductive layer 7 is also formed on the section corresponding to the window section 6B to obtain the structure 400 shown in FIG. 4. A known photo engraving technique may be employed to form the second conductive layer 7. This accomplishes electrical connection between the second conductive layer 7 and the first conductive layer 3.

Figure 5:
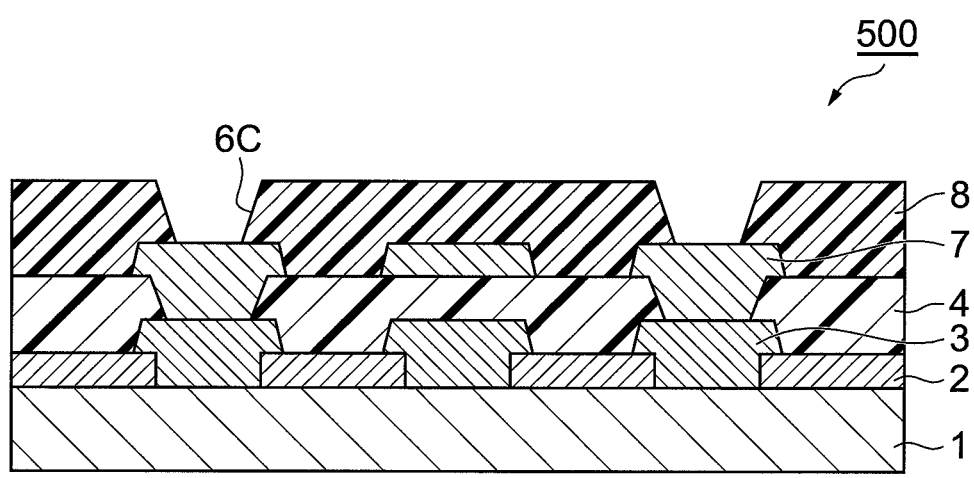
FIG. 5 is a simplified cross-sectional view for explanation of an embodiment of the production steps for a semiconductor device.

Finally, a surface protective layer 8 is formed on the interlayer insulating film 4 and second conductive layer 7 to obtain the semiconductor device 500 shown in FIG. 5. For this embodiment, the surface protective layer 8 is formed in the following manner. First, the positive tone photosensitive composition of the embodiment described above is coated onto the interlayer insulating film 4 and second conductive layer 7 by spin coating, and dried to form a photosensitive resin film. Next, the prescribed sections are photoirradiated through a mask having a pattern drawn corresponding to the window section 6C, and are then developed with an aqueous alkali solution for patterning of the photosensitive resin film. This is followed by heating of the photosensitive resin film for curing, to form a film as the surface protective layer 8. The surface protective layer 8 protects the first conductive layer 3 and second conductive layer 7 from external stress, α-rays and the like, and therefore the semiconductor device 500 has excellent reliability.

The embodiment described above is for a method for producing a semiconductor device having a two-layer wiring structure, but when a multilayer wiring structure having a three-layer or greater structure is to be formed, the aforementioned steps may be repeated for formation of each layer. Specifically, each step for formation of the interlayer insulating film 4 and each step for formation of the surface protective layer 8 may be repeated to form a multilayer pattern. In the example described above, the interlayer insulating film 4 may also be formed using a positive tone photosensitive composition of the invention, instead of only the surface protective layer 8.

[Electronic Component]

An electronic component of the invention will now be described. An electronic component of the invention has a resist pattern formed by the production method described above, as an interlayer insulating film or surface protective layer. Specifically, the resist pattern may be used as a surface protective layer or interlayer insulating film for a semiconductor device, or an interlayer insulating film for a multilayer wiring board. The electronic component of the invention is not particularly restricted so long as it has a surface protective layer or interlayer insulating film formed using the positive tone photosensitive composition described above, and it may have any of a variety of structures.

Furthermore, since the positive tone photosensitive composition has excellent stress-relaxation and adhesion properties, it can even be used as a structural material for packages with different types of structures that have been developed in recent years. Examples of cross-sectional structures for such a semiconductor device are shown in FIG. 6 and FIG. 7.

Figure 6:
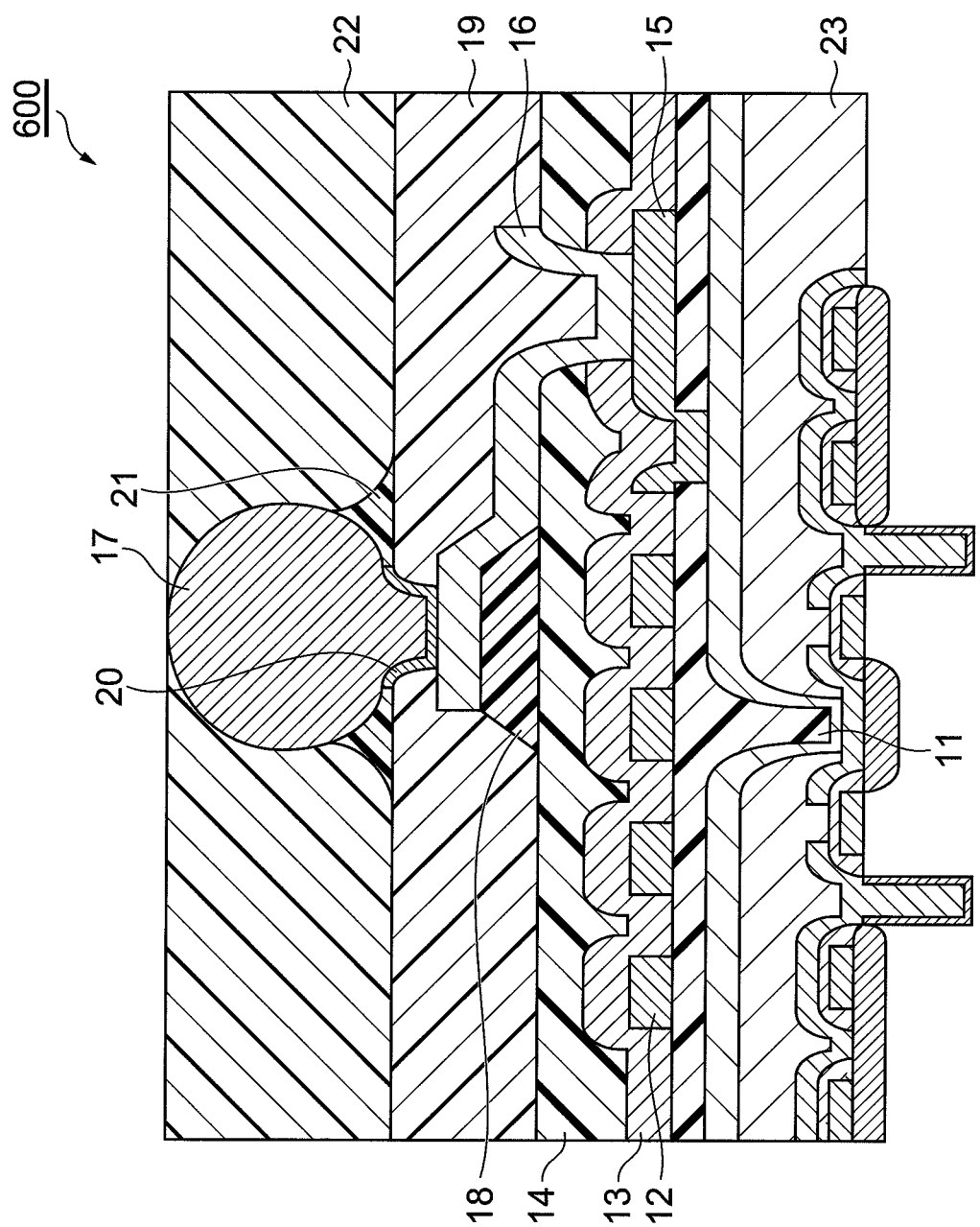
FIG. 6 is a simplified cross-sectional view showing an embodiment of an electronic component (semiconductor device).

FIG. 6 is a simplified cross-sectional view showing a wiring structure as an embodiment of a semiconductor device. The semiconductor device 600 shown in FIG. 6 comprises a silicon chip 23, an interlayer insulating film 11 formed on one side of the silicon chip 23, an Al wiring layer 12 with a pattern including a pad section 15, formed on the interlayer insulating film 11, an insulating layer 13 (for example, a P—SiN layer) and a surface protective layer 14 laminated in that order on the interlayer insulating film 11 and the Al wiring layer 12 while forming an opening over the pad section 15, an island-shaped core 18 situated near the opening on the surface protective layer 14, and a redistribution layer 16 contacting with the pad section 15 inside the opening of the insulating layer 13 and the surface protective layer 14, and extending onto the surface protective layer 14 so as to contact with the side of the core 18 opposite the surface protective layer 14 side. In addition, the semiconductor device 600 comprises a cover coat layer 19 formed covering the surface protective layer 14, the core 18 and the redistribution layer 16, with an opening formed at the section of the redistribution layer 16 over the core 18, a conductive ball 17 which is connected to the redistribution layer 16 via a barrier metal 20 at the opening of the cover coat layer 19, a collar 21 that holds the conductive ball, and an underfill 22 formed on the cover coat layer 19 surrounding the conductive ball 17. The conductive ball 17 is used as an external connecting terminal, and it is formed of solder, gold or the like. The underfill 22 is provided for relaxation of stress when the semiconductor device 600 is mounted.

Figure 7:
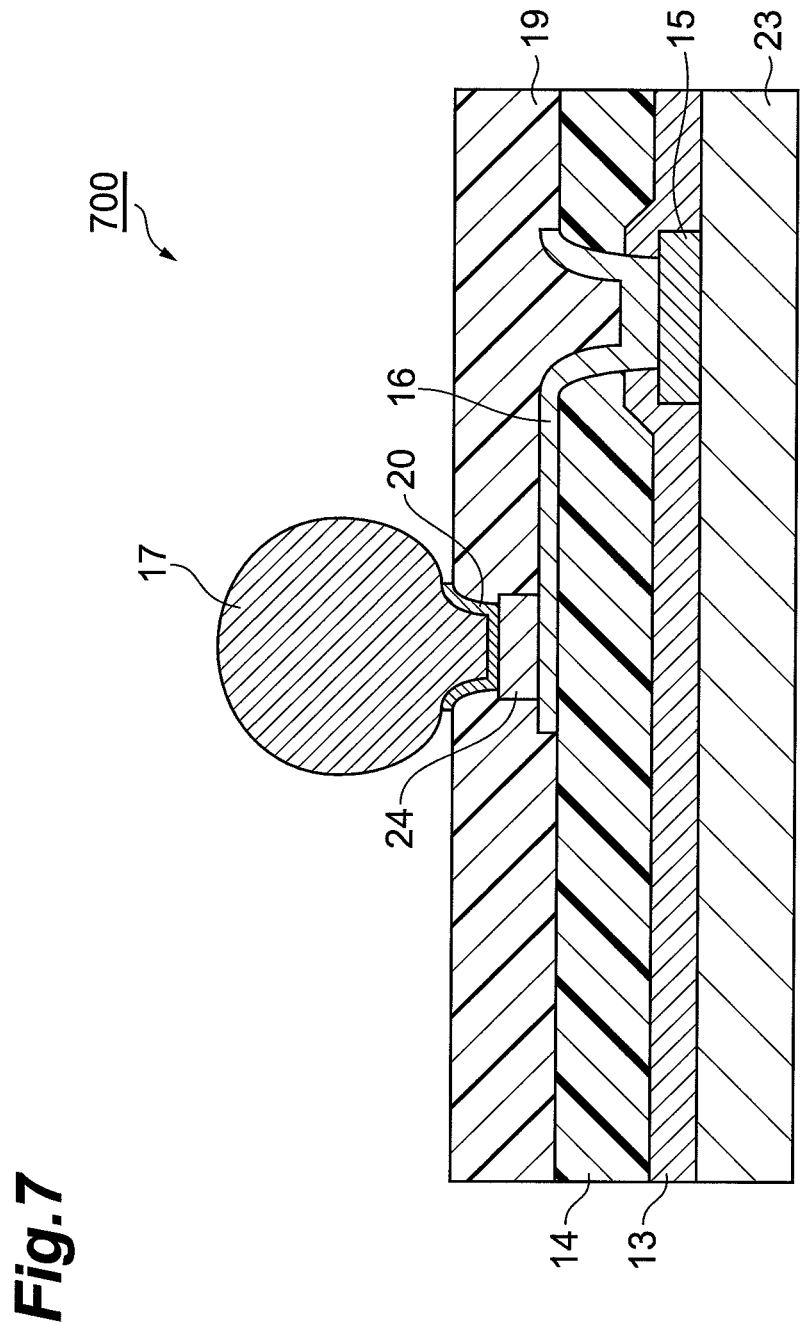
FIG. 7 is a simplified cross-sectional view showing an embodiment of an electronic component (semiconductor device).

FIG. 7 is a simplified cross-sectional view showing a wiring structure as an embodiment of a semiconductor device. In the semiconductor device 700 of FIG. 7 there are formed an Al wiring layer (not shown) on a silicon chip 23 and a pad section 15 of the Al wiring layer, with an insulating layer 13 formed thereover and an element surface protective layer 14 additionally formed. On the pad section 15 there is formed a redistribution layer 16, the redistribution layer 16 extending to the top of a joint 24 with a conductive ball 17. A cover coat layer 19 is also formed on the surface protective layer 14. The redistribution layer 16 is connected to the conductive ball 17 through a barrier metal 20.

In the semiconductor devices shown in FIG. 6 and FIG. 7, the positive tone photosensitive composition can be used as a material to form not only the interlayer insulating layer 11 or surface protective layer 14, but also the cover coat layer 19, core 18, collar 21 and underfill 22. The cured product of the positive tone photosensitive composition has excellent adhesion with metal layers such as the Al wiring layer 12 and redistribution layer 16, and with sealing compounds, while also having a high stress relaxation effect, and therefore a semiconductor device employing the cured product in the surface protective layer 14, the cover coat layer 19, the core 18, the collar 21 made of solder or the like, and the underfill 12 used in flip-chips and the like, exhibits very excellent reliability.

The positive tone photosensitive composition of the invention is particularly suitable for use in the surface protective layer 14 and/or cover coat layer 19 of a semiconductor device having a redistribution layer 16, as in FIG. 6 and FIG. 7.

The film thickness of the surface protective layer or cover coat layer is preferably 3-20 μm and more preferably 5-15 μm.

Using the positive tone photosensitive composition in this manner allows curing to be accomplished by low-temperature heating at 200° C. or below in the heat treatment step, which has conventionally required a temperature of 300° C. or higher. The heating temperature in the heat treatment step is preferably 100° C.-200° C. and more preferably 150° C.-200° C. Moreover, because the positive tone photosensitive composition of the invention exhibits a low degree of the volume shrinkage (cure shrinkage) in the heat treatment step which has been observed with photosensitive polyimides and the like, it is possible to avoid reduction in dimensional precision. The cured film of the positive tone photosensitive composition has a high glass transition temperature. It therefore serves as a surface protective layer or cover coat layer with excellent heat resistance. As a result, it allows efficient, high-yield production of electronic components such as semiconductor devices with excellent reliability.

The present invention is not in any way limited to the preferred embodiment described above.

EXAMPLES

The present invention will now be explained in detail by examples, with the understanding that the invention is not limited to the examples.

Examples 1-12, Comparative Examples 1-3

The following materials were used in Examples 1-12 and Comparative Examples 1-3.

Component (A)

A1: Cresol-novolac resin (cresol/formaldehyde-novolac resin, m-cresol/p-cresol (molar ratio)=60/40, polystyrene-based weight-average molecular weight=12,000, trade name "EP4020G" by Asahi Organic Chemicals Industry Co., Ltd.).

A2: Copolymer of 4-hydroxystyrene/methyl methacrylate=50/50 (molar ratio) (polystyrene-based weight-average molecular weight=10,000, trade name "Maruka Lyncur CMM", by Maruzen Petrochemical Co., Ltd.).

A3: A3 was synthesized as in the following Synthesis Example 1.

Synthesis Example 1

Synthesis of Phenol Resin Modified by Compound Having C4-C100 Unsaturated Hydrocarbon Group After combining 100 parts by mass of phenol, 43 parts by mass of linseed oil and 0.1 parts by mass of trifluoromethanesulfonic acid, the mixture was stirred at 120° C. for 2 hours to obtain a vegetable oil-modified phenol derivative (a). Next, 130 g of the vegetable oil-modified phenol derivative (a), 16.3 g of paraformaldehyde and 1.0 g of oxalic acid were combined and the mixture was stirred at 90° C. for 3 hours. The mixture was then heated to 120° C. and stirred under reduced pressure for 3 hours, after which 29 g of succinic anhydride and 0.3 g of triethylamine were added and the reaction mixture was stirred at 100° C. for 1 hour under atmospheric pressure. The reaction mixture was cooled to room temperature to obtain a phenol resin modified by a compound with a C4-C100 unsaturated hydrocarbon group (hereunder referred to as "A3") as the reaction product (acid value: 120 mgKOH/g). The weight-average molecular weight of A3 determined by GPC, based on standard polystyrene, was approximately 25,000.

Comparative Synthesis Example 1

Synthesis of Alkali-Soluble Resin (A4) Having No Phenolic Hydroxyl Group

In a 0.5 liter flask equipped with a stirrer and thermometer there was placed 4.00 g of 4,4'-diaminodiphenyl ether, and after thoroughly dissolving it in 16.68 g of dehydrated N,N-dimethylacetamide, 8.88 g of 2,2-bis(3,4-dicarboxyphenyl)-1,1,1,3,3,3-hexafluoropropane dianhydride was slowly added. The mixture was then stirred at room temperature (25° C.) for 24 hours to obtain a solution of a polyamide acid (polyimide precursor) (hereunder referred to as "A4").

Component (B)

B1: 1-Naphthoquinone-2-diazide-5-sulfonic acid ester of 1,1-bis(4-hydroxyphenyl)-1-[4-{1-(4-hydroxyphenyl)-1-methylethyl}phenyl]ethane (esterification rate: approximately 90%, trade name "TPPA528", by AZ Electronic Materials).

B2: 1-Naphthoquinone-2-diazide-5-sulfonic acid ester of tris (4-hydroxyphenyl)methane (esterification rate: approximately 95%).

Component (C)

C1: Hexakis(methoxymethyl)melamine (trade name NIKA-LAC MW-30HM" by Sanwa Chemical Co., Ltd., compound represented by the structural formula shown below)

[Chemical Formula 14]

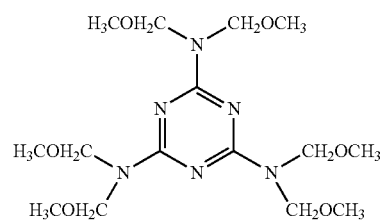

C2: 1,1-bis{3,5-bis(Methoxymethyl)-4-hydroxyphenyl}methane (trade name "TMOM-pp-BPF", by Honshu Chemical Industry Co., Ltd., compound represented by the structural formula shown below)

[Chemical Formula 15]

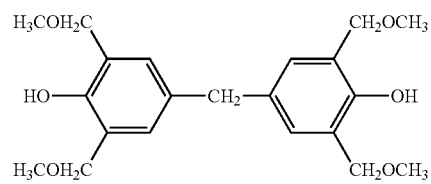

C3: N,N',N",N"'-tetrakis(Methoxymethyl)glycoluryl(trade name "NIKALAC MX-270" by Sanwa Chemical Co., Ltd., compound represented by the structural formula shown below)

[Chemical Formula 16]

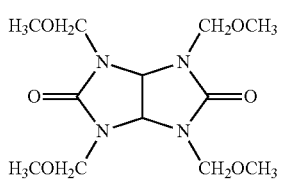

Component (D)

Synthesis Example 2

Synthesis of Acrylic Resin D1

Into a 500 ml three-necked flask equipped with a stirrer, nitrogen inlet tube and thermometer there were weighed out 75 g of toluene and 75 g of isopropanol (IPA), and there were then added separately weighed out portions of polymerizable monomers: 85 g of butyl acrylate (BA), 24 g of lauryl acrylate (DDA), 14 g of acrylic acid (AA) and 7.9 g of 1,2,2,6,6-pentamethylpiperidin-4-yl methacrylate (trade name: FA-711MM by Hitachi Chemical Co., Ltd.), as well as 0.13 g of azobisisobutyronitrile (AIBN). While stirring at room temperature with a stirring rotational speed of approximately 270 rpm, nitrogen gas was introduced for 30 minutes at a flow rate of 400 ml/min, and the dissolved oxygen was removed. The nitrogen gas stream was then cut off and the flask was sealed and warmed to 65° C. for approximately 25 minutes in a thermobath. The same temperature was maintained for 14 hours for polymerization reaction to obtain acrylic resin D1. The polymerization rate was 98%. The weight-average molecular weight (MW) of this A3 determined by GPC, based on standard polystyrene, was approximately 36,000.

Synthesis Examples 3-5

Synthesis of Acrylic Resins D2-D4

Acrylic resins D2-D4 were each synthesized in the same manner as Synthesis Example 2, except for using the polymerizable monomers listed in Table 1. The weight-average molecular weights of the synthesized acrylic resins D2-D4 are shown in Table 1.

TABLE 1

| Polymerizable monomer | D1 | D2 | D3 | D4 |
|---|---|---|---|---|
| FA-711MM | 7.9 g (35 mmol) | 11 g (50 mmol) | 0.56 g (2.5 mmol) | 2.3 g (10 mmol) |
| FA-711HA | — | — | 0.74 g (3.5 mmol) | 3.0 g (14 mmol) |
| BA | 85 g (670 mmol) | 90 g (700 mmol) | 86 g (680 mmol) | 84 g (660 mmol) |
| DDA | 24 g (100 mmol) | 24 g (100 mmol) | — | — |
| AA | 14 g (200 mmol) | 14 g (200 mmol) | 14 g (200 mmol) | 14 g (200 mmol) |
| X-22-2475 | — | — | 15 g (36 mmol) | 15 g (36 mmol) |

TABLE 1-continued

| Polymerizable monomer | D1 | D2 | D3 | D4 |
|---|---|---|---|---|
| Weight-average molecular weight | 36,000 | 30,000 | 20,000 | 23,000 |

FA-711MM: 1,2,2,6,6-Pentamethylpiperidin-4-yl methacrylate (product of Hitachi Chemical Co., Ltd.).
FA-712HM: 2,2,6,6-Tetramethylpiperidin-4-yl methacrylate (product of Hitachi Chemical Co., Ltd.).
BA: n-Butyl acrylate
DDA: Lauryl acrylate
AA: Acrylic acid
X-22-2475: Methacryl-modified silicone oil (Functional group equivalents: 420 g/mol, product of Shin-Etsu Chemical Co., Ltd., compound represented by the structural formula shown below.)
[Chemical Formula 17]

$$H_2C{=}\underset{CH_3}{C}{-}COO{-}Y{-}\left[\underset{CH_3}{\overset{CH_3}{Si}}{-}O\right]_m\underset{CH_3}{\overset{CH_3}{Si}}{-}R$$

(In the formula, Y represents a divalent organic group, R represents a monovalent organic group and m is an integer of 1-10.)

The number of moles of X-22-2475 in Table 1 is the value calculated from the functional group equivalents.

[Preparation of Positive Tone Photosensitive Compositions]

After combining components (A)-(D) in the weights listed in Table 2, 120 g of ethyl lactate as component (E) and 2 g of a 50% methanol solution of ureapropyltriethoxysilane as a coupling agent, the mixture was subjected to pressure filtration using a 3 μm-pore Teflon® filter to prepare positive tone photosensitive compositions for Examples 1-12 and Comparative Examples 1-3.

[Evaluation of Positive Tone Photosensitive Compositions]

(Photosensitive Properties: Film Residue Rate, Sensitivity and Resolution)

The positive tone photosensitive compositions of Examples 1-12 and Comparative Examples 1-3 were each spin coated onto a silicon substrate and heated at 120° C. for 3 minutes, to form a coating film with a film thickness of 11-13 μm. Next, an i-line stepper (trade name: "FPA-3000iW" by Canon Inc.) was used for reduction projection exposure of i-lines (365 nm) through a mask. Following exposure, a 2.38% aqueous solution of tetramethylammonium hydroxide (TMAH) was used for development. The residual film thickness after development was approximately 80-99% of the initial film thickness. This was followed by rinsing with water, and the minimum exposure dose necessary for pattern formation and the size of the smallest open square hole pattern were determined. The minimum exposure dose was used as an index of the sensitivity, and the size of the smallest open square hole pattern was used as an index of the resolution. The results are shown in Table 3.

The film residue rate was calculated by the following formula.

Film residue rate (%)=(thickness of coating film after development/thickness of coating film before development)×100

(Cure Shrinkage Rate)

The positive tone photosensitive compositions of Examples 1-12 and Comparative Examples 1-3 were each spin coated onto a silicon substrate and heated at 120° C. for 3 minutes, to form a coating film with a film thickness of approximately 12-14 μm. Next, a Proximity exposure device (trade name: PLA-600FA, by Canon Inc.) was used for total exposure of the coating film through a mask with all of wave length. Following exposure, a 2.38% aqueous solution of TMAH was used for development to obtain a 10 mm-wide rectangular pattern. Next, the rectangular pattern was subjected to heat treatment (curing) by method (i) or (ii) below, to obtain a cured film with a film thickness of approximately 10 μm. Table 3 shows the curing conditions, and the cure shrinkage rate for the film thicknesses before and after curing (=[1−(film thickness after curing/film thickness before curing)]× 100) [%].

(i) The coating film was subjected to heat treatment for 2 hours using a vertical diffusion furnace (trade name: "μ-TF" by Koyo Thermo System Co., Ltd.) in nitrogen at a temperature of 175° C. (temperature elevating time: 1.5 hours).

(ii) Heat treatment was conducted for 2 hours using a frequency-variable microwave curing furnace (trade name: "Microcure 2100" by Lambda Technologies), with a microwave output of 450 W, a microwave frequency of 5.9-7.0 GHz and a temperature of 165° C. (temperature elevating time: 5 minutes).

(Cured Film Properties: Tg, Breaking Elongation, Elastic Modulus)

An approximately 10 μm-thick cured film, obtained in the same manner as for the evaluation of cure shrinkage rate described above, was released from the silicon substrate, and the glass transition temperature (Tg) of the released film was measured with a TMA/SS600 by Seiko Instruments, Inc. For the measurement, the width of the sample was 2 mm, the film thickness was 9-11 μm and the chuck gap was 10 mm. The load was 10 g and the temperature-elevating rate was 5° C./min. The breaking elongation (EL) and Young's modulus (YM) of the cured film were also measured with an AGS-H100N autograph by Shimadzu Corp. For the measurement, the width of the sample was 10 mm, the film thickness was 9-11 μm and the chuck gap was 20 mm. The pull rate was 5 mm/min, and the measuring temperature was approximately room temperature (20° C.-25° C.). The averages for the measured values for at least 5 test pieces obtained from a cured film obtained under the same conditions were recorded as "breaking elongation (EL)" and "elastic modulus (YM)". The measured Tg, EL and YM values are shown in Table 3. Tg is preferably high, the breaking elongation is preferably large and the elastic modulus is preferably low.

(Residual Stress)

The positive tone photosensitive compositions of Examples 1-12 and Comparative Examples 1-3 were each spin coated onto a 5-inch silicon substrate and heated at 120° C. for 3 minutes, to form coating films each with a film thickness of approximately 11 μm. Each coating film on the substrate was cured by method (i) or (ii) above. The residual stress of the curing substrate was measured with a stress measuring device (Model FLX-2320) by Tencor. The measuring temperature was 23° C. The results are shown in Table 3. A smaller degree of residual stress is more satisfactory.

(Relative Permittivity)

The positive tone photosensitive compositions of Examples 1-12 and Comparative Examples 1-3 were each spin coated onto a low resistance silicon substrate and heated at 120° C. for 3 minutes, to form coating films each with a film thickness of approximately 11 μm. Each coating film on the substrate was cured by method (i) or (ii) above. A 2 mm-diameter aluminum electrode was formed on a cured film using a vacuum vapor deposition apparatus. Next, the charge capacity between the aluminum electrode and the silicon substrate was measured using a measuring apparatus comprising an HP 16451 test fixture dielectric material by Yokogawa Electric Corp. connected to an HP4192A LF impedance analyzer by Yokogawa Electric Corp. The measuring environment was at room temperature (20° C.-25° C.), a humidity of 40-50% RH, a measuring frequency of 10 kHz and a bias voltage of −35 V. The relative permittivity of the cured film was calculated from the measured charge capacity value of the electrode and the film thickness value near the electrode. The results are shown in Table 3. A smaller relative permittivity is more satisfactory.

(Adhesiveness)

The positive tone photosensitive compositions of Examples 1-12 and Comparative Examples 1-3 were each spin coated onto a substrate (a substrate obtained by sputtering TiN onto a silicon substrate and further sputtering copper onto the TiN) and heated at 120° C. for 3 minutes, to form coating films each with a film thickness of approximately 12-14 μm. Each coating film was cured by method (i) or (ii) above to obtain a cured film with a film thickness of approximately 10 μm. The cured film was cut into a small piece together with the substrate, and an aluminum stud was bonded to the cured film via an epoxy resin layer. The stud was then pulled and the load during release was measured. The results are shown in Table 3. A larger adhesiveness is most satisfactory.

(Thermal Shock Resistance)

The positive tone photosensitive compositions of Examples 1-12 and Comparative Examples 1-3 were each spin coated onto a redistribution-formed substrate and heated at 120° C. for 3 minutes, to form coating films each with a film thickness of approximately 20 μm. Next, a Proximity exposure device (trade name: PLA-600FA, by Canon Inc.) was used for total exposure (800 mJ/cm$^2$) of each coating film through a mask with all of wave length. Following exposure, development was performed with a 2.38% aqueous solution of TMAH, and after forming a 200 μm-square via hole, the coating film was cured by method (i) or (ii) above to form a cover coat film. After forming an under barrier metal on the open section, a solder ball was formed by bumping and a test part was fabricated, having the same wiring structure as the semiconductor device shown in FIG. 7. The test part was mounted and sealed to obtain a test sample. The test sample was subjected to a temperature cycling test (−55° C.-125° C., 2000 cycles), and the presence of cracking and peeling was visually observed and evaluated on the following scale. The results are shown in Table 3.

a: No defects such as cracking or peeling even with 2000 cycles.
b: No defects such as cracking or peeling after 1000 cycles, some defects such as cracking or peeling after 2000 cycles.
c: Some defects such as cracking or peeling after 1000 cycles.

TABLE 2

|  |  | Example |  |  |  |  |  |  |  |  |  |  |  | Comp. Ex. |  |  |
|---|---|---|---|---|---|---|---|---|---|---|---|---|---|---|---|---|
| Component | Material | 1 | 2 | 3 | 4 | 5 | 6 | 7 | 8 | 9 | 10 | 11 | 12 | 1 | 2 | 3 |
| (A) | A1 | 100 | 100 | 100 | 100 | — | — | 85 | 100 | 100 | 100 | 100 | 100 | 100 | 85 | — |
|  | A2 | — | — | — | — | 100 | — | — | — | — | — | — | — | — | — | — |

TABLE 2-continued

| Component | Material | Example | | | | | | | | | | | | Comp. Ex. | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 | 3 |
| | A3 | — | — | — | — | — | 100 | 15 | — | — | — | — | — | — | 15 | — |
| | A4 | — | — | — | — | — | — | — | — | — | — | — | — | — | — | 100 |
| (B) | B1 | 15 | 15 | 15 | 15 | 15 | 15 | 15 | — | 15 | 15 | 15 | 15 | 15 | 15 | 15 |
| | B2 | — | — | — | — | — | — | — | 15 | — | — | — | — | — | — | — |
| (C) | C1 | 15 | 15 | 15 | 15 | 15 | 15 | 15 | 15 | — | — | 15 | 15 | 15 | 15 | 15 |
| | C2 | — | — | — | — | — | — | — | — | 15 | — | — | — | — | — | — |
| | C3 | — | — | — | — | — | — | — | — | — | 15 | — | — | — | — | — |
| (D) | D1 | 10 | — | — | — | 10 | 10 | 10 | 10 | 10 | 10 | 5 | 20 | — | — | 10 |
| | D2 | — | 10 | — | — | — | — | — | — | — | — | — | — | — | — | — |
| | D3 | — | — | 10 | — | — | — | — | — | — | — | — | — | — | — | — |
| | D4 | — | — | — | 10 | — | — | — | — | — | — | — | — | — | — | — |

The numerical values in Table 2 are for the contents (units: g).

TABLE 3

| Physical property | Example | | | | | | | | | | | | Comp. Ex. | | |
|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 |
| Film residue rate (%) | 97 | 93 | 96 | 95 | 90 | 89 | 95 | 91 | 90 | 92 | 95 | 95 | 93 | 94 | 80 |
| Sensitivity (mJ/cm$^2$) | 340 | 350 | 300 | 310 | 450 | 380 | 330 | 420 | 300 | 380 | 400 | 310 | 500 | 500 | 800 |
| Resolution (μm) | 8 | 8 | 8 | 8 | 8 | 10 | 8 | 10 | 10 | 10 | 8 | 10 | 8 | 10 | 30 |
| Curing conditions | i | ii | i | i | i | i | i | i | i | i | i | i | i | i | i |
| Curing shrinkage (%) | 12 | 12 | 11 | 12 | 11 | 13 | 15 | 12 | 13 | 10 | 12 | 15 | 10 | 14 | 15 | 20 |
| Tg (° C.) | 193 | 192 | 191 | 190 | 190 | 185 | 177 | 190 | 192 | 195 | 189 | 190 | 180 | Unmeasurable | 190 | 180 |
| Breaking elongation (%) | 19 | 18 | 15 | 18 | 15 | 10 | 25 | 22 | 14 | 11 | 12 | 10 | 23 | 1 | 10 | 20 |
| Elastic modulus (GPa) | 2.0 | 2.1 | 2.2 | 2.0 | 2.1 | 2.3 | 2.0 | 2.0 | 2.3 | 2.5 | 2.5 | 2.5 | 2.0 | 3.5 | 2.9 | 3.5 |
| Residual stress (MPa) | 21 | 18 | 23 | 20 | 22 | 24 | 18 | 19 | 22 | 23 | 23 | 24 | 17 | 30 | 25 | 30 |
| Relative permittivity (–) | 3.5 | 3.4 | 3.6 | 3.4 | 3.6 | 2.9 | 3.7 | 3.6 | 3.5 | 3.7 | 3.5 | 3.4 | 3.8 | 3.4 | 3.5 | 4.0 |
| Adhesiveness (Kgf/cm$^2$)* | 500 | 510 | 480 | 460 | 430 | 420 | 470 | 480 | 450 | 440 | 460 | 410 | 510 | 380 | 450 | 390 |
| Thermal shock resistance | a | a | b | a | b | b | a | a | b | b | b | b | a | c | b | b |

*(1 kgf/cm$^2$ = 0.1 MPa)

As clearly seen from Table 3, the sensitivities of the positive tone photosensitive compositions of Examples 1-12 were sufficiently high. Also, the cured films formed from the positive tone photosensitive compositions of Examples 1-12 all exhibited low shrinkage rate factors of 15% or lower. Furthermore, the positive tone photosensitive compositions of Examples 1-12 had satisfactory Tg and breaking elongation values even with curing at 175° C. With the positive tone photosensitive composition of Example 1, microwave curing at 165° C. (curing conditions (ii)) resulted in a Tg and breaking elongation roughly equivalent to thermosetting at 175° C. (curing conditions (i)), thus confirming that even lower temperature curing is possible.

The elastic modulus for each of the cured films of the positive tone photosensitive compositions of Examples 1-12 was a low elastic modulus of not greater than 2.5 GPa. A low cured film elastic modulus tends to results in less residual stress on the substrate on which the cured film has been formed. As clearly seen in Table 3, the residual stress was low, at not greater than 25 MPa, for the substrates on which the cured films of the positive tone photosensitive compositions of Examples 1-12 had been formed.

As also clearly seen in Table 3, the relative permittivities were satisfactory, at not greater than 3, for the cured films of the positive tone photosensitive compositions of Examples 1-5, which employed poly(hydroxystyrene) as component (A2) in component (A). In addition, the results of stud pull testing and temperature cycling testing revealed that the cured films of the positive tone photosensitive compositions of Examples 1-12 also had excellent adhesiveness for copper (≧450 kgf/cm$^2$). The thermal shock resistance was also high, and therefore no defects such as cracking or peeling occurred in the test samples after temperature cycling testing.

On the other hand, the positive tone photosensitive compositions of Comparative Examples 1-2 which contained no component (D) had high resolution, but their sensitivities were low at ≧500 mJ/cm$^2$. The positive tone photosensitive composition of Comparative Example 1 had low cured film breaking elongation of 1% and was brittle, such that the Tg could not be measured. Moreover, the residual stress was high due to the high elastic modulus of the cured film. The resist pattern also had low adhesiveness for copper and low thermal shock resistance. The positive tone photosensitive compositions of Comparative Examples 1-3, which employed polyamide acids (polyimide precursors) as alkali-soluble resins with no phenolic hydroxyl groups as component (A), had low sensitivity, resolution and adhesiveness.

Examples 13-27

<Preparation of Positive Tone Photosensitive Compositions>
(A) A1 and A3 were Prepared as Alkali-Soluble Resins Having Phenolic Hydroxyl Groups.
A1: Cresol-novolac resin (cresol/formaldehyde-novolac resin, m-cresol/p-cresol (molar ratio)=60/40, polystyrene-based weight-average molecular weight=13,000, trade name "EP4020G" by Asahi Organic Chemicals Industry Co., Ltd.).
A3: Phenol resin modified by compound with C4-C100 unsaturated hydrocarbon group, obtained in Synthesis Example 1.

(B) B1 was prepared as a compound that produces an acid by light.
B1: 1-Naphthoquinone-2-diazide-5-sulfonic acid ester of 1,1-bis(4-hydroxyphenyl)-1-[4-{1-(4-hydroxyphenyl)-1-methylethyl}phenyl]ethane (esterification rate: approximately 90%, trade name "TPPA528", by AZ Electronic Materials).

(C) C1-C3 were prepared as thermal crosslinking agents.
C1: Hexakis(methoxymethyl)melamine (trade name NIKALAC MW-30HM" by Sanwa Chemical Co., Ltd.) was prepared.
C2: 1,1-bis{3,5-bis(Methoxymethyl)-4-hydroxyphenyl}methane (trade name "TMOM-pp-BPF", by Honshu Chemical Industry Co., Ltd.)
C3: N,N',N'',N'''-tetrakis(Methoxymethyl)glycoluryl(trade name "NIKALAC MX-270" by Sanwa Chemical Co., Ltd.)

(D) D1 and D3 were prepared as acrylic resins.
D1: Acrylic resin D1 obtained in Synthesis Example 2.
D3: Acrylic resin D3 obtained in Synthesis Example 4.

Compounds E1-E4 that produce acids by heat were prepared for component (E).
E1: Trimethylsulfonium methylsulfate (TSMS, product of Fluorochem).
E2: Tri-p-tolylsulfoniumtrifluoromethane sulfonate (TSTMS, product of Tokyo Chemical Industry Co., Ltd.).
E3: Trimethylsulfoniumtrifluoromethane sulfonate (MES, product of Hitachi Chemical Co., Ltd.).
E4: Pyridinium-p-toluene sulfonate (PTS, product of Midori Kagaku Co., Ltd.).

The solvent ethyl lactate was prepared as a solvent component.

[Preparation of Positive Tone Photosensitive Compositions]

Components (A)-(E) were mixed in the proportions listed in Tables 4 and 5, and then 2 parts by mass of a 50% methanol solution of ureapropyltriethoxysilane was added as a coupling agent (adhesion aid). The solution was subjected to pressure filtration using a 3 μm-pore Teflon® filter, to prepare solutions of the positive tone photosensitive compositions of Examples 13-23. The units for the mixing proportions of the components listed in Table 4 are parts by mass.

Components (A)-(D) were also mixed in the proportions listed in Table 5, without using component (E), and then 2 parts by mass of a 50% methanol solution of ureapropyltriethoxysilane was added as a coupling agent (adhesion aid). The solution was subjected to pressure filtration using a 3 μm-pore Teflon® filter, to prepare solutions of the positive tone photosensitive compositions of Examples 24 and 25. The units for the mixing proportions of the components listed in Table 5 are parts by mass.

TABLE 4

| Component | | Example | | | | | | |
|---|---|---|---|---|---|---|---|---|
| | | 13 | 14 | 15 | 16 | 17 | 18 | 19 |
| (A) | A1 | 80 | 80 | 80 | 80 | 80 | 80 | 80 |
| | A3 | 20 | 20 | 20 | 20 | 20 | 20 | 20 |
| (B) | B1 | 10 | 10 | 10 | 10 | 10 | 10 | 10 |
| (C) | C1 | 10 | 10 | 10 | 10 | 10 | 10 | 10 |
| | C2 | — | — | — | — | — | — | — |
| | C3 | — | — | — | — | — | — | — |
| (D) | D1 | 10 | 10 | 10 | — | — | — | 10 |
| | D3 | — | — | — | 10 | 10 | 10 | — |
| (E) | E1 | 3 | — | — | 2 | 2 | 1 | — |
| | E2 | — | 3 | — | — | — | — | — |
| | E3 | — | — | 3 | — | — | — | — |
| | E4 | — | — | — | — | — | — | 3 |

TABLE 5

| Component | | Example | | | | | | | |
|---|---|---|---|---|---|---|---|---|---|
| | | 20 | 21 | 22 | 23 | 24 | 25 | 26 | 27 |
| (A) | A1 | 80 | 80 | 80 | 80 | 80 | 80 | 80 | 80 |
| | A3 | 20 | 20 | 20 | 20 | 20 | 20 | 20 | 20 |
| (B) | B1 | 10 | 10 | 10 | 10 | 10 | 10 | 10 | 10 |
| (C) | C1 | — | — | — | — | 10 | 10 | 10 | 10 |
| | C2 | 10 | 10 | 10 | — | — | — | — | — |
| | C3 | — | — | — | 10 | — | — | — | — |
| (D) | D1 | — | — | — | 10 | 10 | — | 10 | 10 |
| | D3 | 10 | 10 | 10 | — | — | 10 | — | — |
| (E) | E1 | 3 | — | — | 3 | — | — | 0.4 | 0.25 |
| | E2 | — | 3 | — | — | — | — | — | — |
| | E3 | — | — | 3 | — | — | — | — | — |
| | E4 | — | — | — | — | — | — | — | — |

[Evaluation of Photosensitive Resin Compositions]

Solutions of the photosensitive resin compositions obtained in Examples 13-27 were used for evaluation of pattern melting by the following method. The results are shown in Table 6.

(Pattern Melting)

After irradiation at 1000 mJ/cm2 through a resolution evaluation mask, development was performed with a 2.38% TMAH aqueous solution. The developed pattern was heated with a hot plate at 100° C./5 min, 120° C./5 min and 150° C./5 min, and the shapes of 40 μm squares in the pattern were compared.

Figure 8:
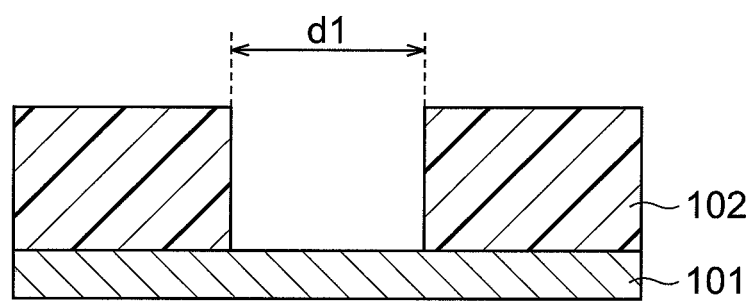
FIG. 8 is a schematic cross-sectional view showing the developed pattern of a photosensitive resin composition according to an example of the invention.
Figure 9:
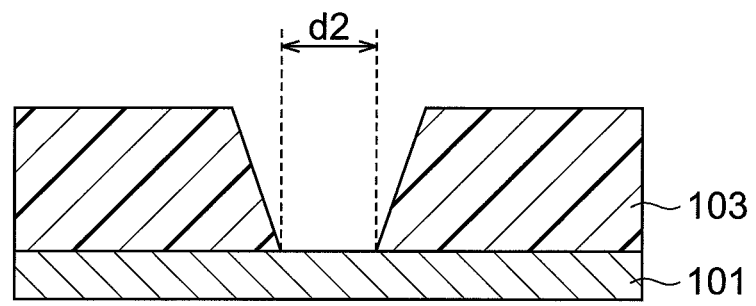
FIG. 9 is a schematic cross-sectional view showing the cured pattern of a photosensitive resin composition according to an example of the invention.

FIG. 8 is a schematic cross-sectional view of a developed pattern, and FIG. 9 is a schematic cross-sectional view of a cured pattern. In FIGS. 8 and 9, 101 indicates a Si wafer, 102 indicates a photosensitive resin composition layer and 103 indicates a layer comprising the cured photosensitive resin composition. For this test, the developed pattern diameter d1 and the cured pattern diameter d2 were compared, the change in pattern diameter was defined according to the following formula:

Change in pattern diameter=|cured pattern diameter−developed pattern diameter|/developed pattern diameter, and evaluation was made on the following scale. The results are shown in Table 6.
A: 0-10%
B: 11-20%
C: 21-30%
D: ≧31%

(Film Residue Rate after Development)

After irradiation at 1000 mJ/cm2 through a resolution evaluation mask, development was performed with a 2.38% TMAH aqueous solution, the film thicknesses before development and after development of the unexposed sections were compared, the film residue rate after development was defined according to the following formula:

Film residue rate after development=film thickness of unexposed sections after development/film thickness before development (coated film thickness), and evaluation was made on the following scale.
A: 0.95-1.0
B: 0.90-0.94
C, 0.80-0.89
D: ≦0.79

(Cured Film Properties: Tg, Breaking Elongation, Elastic Modulus)

The positive tone photosensitive compositions obtained in Examples 2-1 to 2-7, 2-12 and 2-13 were each spin coated onto a silicon substrate and heated at 120° C. for 3 minutes, to form a coating film with a film thickness of approximately 12-14 μm. Next, a Proximity exposure device (trade name: PLA-600FA, by Canon Inc.) was used for total exposure of the coating film through a mask with all of wave length. Following exposure, a 2.38% aqueous solution of TMAH was used for development to obtain a 10 mm-wide rectangular pattern. The rectangular pattern of the coating film was then subjected to heat treatment (curing) for 2 hours using a vertical diffusion furnace (trade name: "μ-TF" by Koyo Thermo System Co., Ltd.) in nitrogen at a temperature of 175° C. (temperature elevating time: 1.5 hours), to obtain a cured film with a film thickness of approximately 10 μm.

An approximately 10 μm-thick cured film, obtained in the same manner as described above, was released from the silicon substrate, and the glass transition temperature (Tg) of the released film was measured with a TMA/SS600 by Seiko Instruments, Inc. For the measurement, the width of the sample was 2 mm, the film thickness was 9-11 μm and the chuck gap was 10 mm. The load was 10 g and the temperature-elevating rate was 5° C./min. The breaking elongation (EL) and Young's modulus (YM) of the cured film were also measured with an AGS-H100N autograph by Shimadzu Corp. For the measurement, the width of the sample was 10 mm, the film thickness was 9-11 μm and the chuck gap was 20 mm. The pull rate was 5 mm/min, and the measuring temperature was approximately room temperature (20° C.-25° C.). The averages for the measured values for at least 5 test pieces obtained from a cured film obtained under the same conditions were recorded as "breaking elongation (EL)" and "elastic modulus (YM)". The measured Tg, EL and YM values are shown in Table 6.

TABLE 6

|  | Exposure dose (mJ/cm$^2$) | Post-development film residue rate | Pattern melting | Tg (° C.) | EL (%) | YM (GPa) |
| --- | --- | --- | --- | --- | --- | --- |
| Example 13 | 1000 | A | A | 202 | 8 | 2.7 |
| Example 14 | 1000 | B | B | 200 | 10 | 2.7 |
| Example 15 | 1000 | B | B | 190 | 11 | 2.6 |
| Example 16 | 1000 | A | A | 194 | 17 | 2.1 |
| Example 17 | 1000 | A | A | 194 | 23 | 2.3 |
| Example 18 | 1000 | A | A | 196 | 27 | 2.3 |
| Example 19 | 1000 | B | C | 200 | 9 | 2.6 |
| Example 20 | 1000 | B | A | 200 | 7 | 2.3 |
| Example 21 | 1000 | B | B | 198 | 13 | 2.2 |
| Example 22 | 1000 | B | B | 194 | 10 | 2.3 |
| Example 23 | 1000 | B | A | 200 | 11 | 2.7 |
| Example 24 | 1000 | B | D | 189 | 10 | 2.6 |
| Example 25 | 1000 | B | D | 190 | 13 | 2.2 |
| Example 26 | 1000 | A | C | 193 | 18 | 2.5 |
| Example 27 | 1000 | A | C | 194 | 20 | 2.5 |

As clearly seen in Table 6, the positive tone photosensitive compositions of Examples 13-23, 26 and 27 had minimized pattern melting. In addition, it was confirmed that the positive tone photosensitive compositions of Examples 13-23, 26 and 27, even with addition of a compound that produces an acid by heat, formed films having properties equivalent to those of materials which did not contain an added compound that produces an acid by heat, as in Examples 24 and 25.

INDUSTRIAL APPLICABILITY

The positive tone photosensitive composition of the invention can be used to form surface protective layers and interlayer insulating films on semiconductor elements to be mounted on electronic devices, as well as redistribution layers for semiconductor packages.

EXPLANATION OF SYMBOLS

1: Semiconductor board, 2: protective film, 3: first conductive layer, 4: interlayer insulating film, 5: photosensitive resin layer, 6A, 6B, 6C: window sections, 7: second conductive layer, 8: surface protective layer, 11: interlayer insulating film, 12: wiring layer, 12: underfill, 13: insulating layer, 14: surface protective layer, 15: pad section, 16: redistribution layer, 17: conductive ball, 18: core, 19: cover coat layer, 20: barrier metal, 21: collar, 22: underfill, 23: silicon chip, 24: joint, 100, 200, 300, 400: structures, 101: Si wafer, 102: photosensitive resin composition layer, 103: layer composed of cured photosensitive resin composition, 500: semiconductor device, 600: semiconductor device, 700: semiconductor device.

The invention claimed is:

1. A positive tone photosensitive composition, comprising:
an alkali-soluble resin having a phenolic hydroxyl group,
a compound producing an acid by light,
a thermal crosslinking agent and
an acrylic resin.

2. The positive tone photosensitive composition according to claim 1, wherein the alkali-soluble resin having a phenolic hydroxyl group is a phenol resin.

3. The positive tone photosensitive composition according to claim 1, wherein the alkali-soluble resin having a phenolic hydroxyl group contains a phenol resin having no unsaturated hydrocarbon group and a modified phenol resin having an unsaturated hydrocarbon group.

4. The positive tone photosensitive composition according to claim 3, wherein the modified phenol resin having an unsaturated hydrocarbon group is further modified by reaction between a phenolic hydroxyl group and a polybasic acid anhydride.

5. The positive tone photosensitive composition according to claim 3, wherein the modified phenol resin having an unsaturated hydrocarbon group is a phenol resin modified by a compound having a C4-C100 unsaturated hydrocarbon group.

6. The positive tone photosensitive composition according to claim 3, wherein the ratio $M_{A1}/M_{A2}$ of the mass $M_{A1}$ of the phenol resin having no unsaturated hydrocarbon group and the mass $M_{A2}$ of the modified phenol resin having an unsaturated hydrocarbon group is 5/95-95/5.

7. The positive tone photosensitive composition according to claim 1, wherein the compound producing an acid by light is an o-quinonediazide compound.

8. The positive tone photosensitive composition according to claim 1, wherein the content of the compound producing an acid by light is 3-100 parts by mass with respect to 100 parts by mass as the content of the alkali-soluble resin having a phenolic hydroxyl group.

9. The positive tone photosensitive composition according to claim 1, wherein the acrylic resin is an acrylic resin having one or more structural units represented by the following formulas (1)-(3):

[Chemical Formula 1]

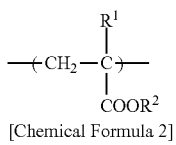
(1)

[Chemical Formula 2]

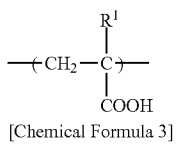
(2)

[Chemical Formula 3]

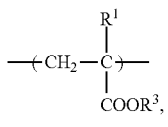
(3)

wherein $R^1$ represents hydrogen atom or a methyl group, $R^2$ represents a C4-C20 alkyl group, and $R^3$ represents a monovalent organic group having a primary, secondary or tertiary amino group.

10. The positive tone photosensitive composition according to claim 9, wherein the acrylic resin is one having a structural unit represented by formula (1) and a structural unit represented by formula (2).

11. The positive tone photosensitive composition according to claim 9, wherein the acrylic resin is one having a structural unit represented by formula (1), a structural unit represented by formula (2) and a structural unit represented by formula (3).

12. The positive tone photosensitive composition according to claim 1, further comprising a compound producing an acid by heat.

13. The positive tone photosensitive composition according to claim 12, wherein the compound producing an acid by heat has a structure represented by the following formula (4):

[Chemical Formula 4]

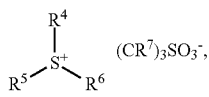
(4)

wherein $R^4$, $R^5$ and $R^6$ each independently represents an alkyl group or aryl group, and $R^7$ represents hydrogen atom or fluorine atom.

14. The positive tone photosensitive composition according to claim 1, further comprising an elastomer.

15. A method for producing a resist pattern comprising:
a step of exposing a photosensitive resin film formed using a positive tone photosensitive composition according to claim 1,
a step of developing the exposed photosensitive resin film with an aqueous alkali solution to obtain a patterned photosensitive resin film, and
a step of heating the patterned photosensitive resin film.

16. The method for producing a resist pattern according to claim 15, wherein the step of heating is a step of heating the patterned photosensitive resin film at not higher than 200° C.

17. A semiconductor device comprising a resist pattern formed by the method for producing a resist pattern according to claim 15, as an interlayer insulating film or surface protective layer.

18. A semiconductor device comprising a resist pattern formed by the method for producing a resist pattern according to claim 15, as a cover coat layer.

19. A semiconductor device comprising a resist pattern formed by the method for producing a resist pattern according to claim 15, as a core for a redistribution layer.

20. A semiconductor device comprising a resist pattern formed by the method for producing a resist pattern according to claim 15, as a collar to hold a conductive ball serving as an external connecting terminal.

21. A semiconductor device comprising a resist pattern formed by the method for producing a resist pattern according to claim 15, as an underfill.

22. A semiconductor device comprising a resist pattern formed by the method for producing a resist pattern according to claim 15, as a surface protective layer and/or cover coat layer for a redistribution layer.

23. An electronic device comprising a semiconductor device according to claim 17.

24. An electronic device comprising a semiconductor device according to claim 18.

25. An electronic device comprising a semiconductor device according to claim 19.

26. An electronic device comprising a semiconductor device according to claim 20.

27. An electronic device comprising a semiconductor device according to claim 21.

28. An electronic device comprising a semiconductor device according to claim 22.

* * * * *